US011669009B2

(12) United States Patent
Sreenivasan et al.

(10) Patent No.: US 11,669,009 B2
(45) Date of Patent: Jun. 6, 2023

(54) ROLL-TO-ROLL PROGRAMMABLE FILM IMPRINT LITHOGRAPHY

(71) Applicant: Board of Regents, The University of Texas System, Austin, TX (US)

(72) Inventors: Sidlgata V. Sreenivasan, Austin, TX (US); Shrawan Singhal, Austin, TX (US); Ovadia Abed, Austin, TX (US); Lawrence Dunn, Austin, TX (US); Paras Ajay, Austin, TX (US); Ofodike Ezekoye, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 1041 days.

(21) Appl. No.: 16/322,842

(22) PCT Filed: Aug. 3, 2017

(86) PCT No.: PCT/US2017/045368
§ 371 (c)(1),
(2) Date: Feb. 1, 2019

(87) PCT Pub. No.: WO2018/027069
PCT Pub. Date: Feb. 8, 2018

(65) Prior Publication Data
US 2021/0341833 A1 Nov. 4, 2021

Related U.S. Application Data

(60) Provisional application No. 62/370,259, filed on Aug. 3, 2016.

(51) Int. Cl.
*G03F 7/00* (2006.01)
*B82Y 40/00* (2011.01)
*G01Q 60/24* (2010.01)

(52) U.S. Cl.
CPC ............ *G03F 7/0002* (2013.01); *B82Y 40/00* (2013.01); *G01Q 60/24* (2013.01)

(58) Field of Classification Search
CPC ............... Y10S 977/887; G03F 7/0002; B29C 59/00; B05D 3/06; H01L 21/7684; H01L 21/32115
See application file for complete search history.

(56) References Cited

U.S. PATENT DOCUMENTS 6,980,282 B2   12/2005   Choi et al.
6,982,783 B2   1/2006    Choi et al.
(Continued)

FOREIGN PATENT DOCUMENTS

WO   2018027073 A1   2/2018

OTHER PUBLICATIONS

K. Ishikiriyama et al, Journal of Colloid and Interface Science 173, 419-428(1995). (Year: 1995).*
(Continued)

*Primary Examiner* — Tabassom Tadayyon Eslami
(74) *Attorney, Agent, or Firm* — Robert A. Voigt, Jr.; Shackelford, Bowen, McKinley & Norton, LLP

(57) ABSTRACT

A method for fabricating patterns on a flexible substrate in a roll-to-roll configuration. Drops of a monomer diluted in a solvent are dispensed on a substrate, where the drops spontaneously spread and merge with one another to form a liquid resist formulation. The solvent is evaporated (e.g., blanket evaporation) from the liquid resist formulation followed by selective multi-component resist film evaporation resulting in a non-uniform and substantially continuous film on the substrate. The gap between the film on the substrate and a template is closed such that the film fills the features of the template. After cross-linking the film to polymerize
(Continued)

the film, the template is separated from the substrate thereby leaving the polymerized film on the substrate.

16 Claims, 16 Drawing Sheets

(56) References Cited

U.S. PATENT DOCUMENTS

| | | | |
|---|---|---|---|
| 7,019,819 | B2 | 3/2006 | Choi et al. |
| 8,211,214 | B2 | 7/2012 | Xu et al. |
| 8,369,696 | B2 | 2/2013 | Choi |
| 8,470,188 | B2 | 6/2013 | Menezes |
| 8,541,053 | B2 | 9/2013 | Menezes et al. |
| 9,415,418 | B2 | 8/2016 | Sreenivasan et al. |
| 9,616,614 | B2 | 4/2017 | Choi et al. |
| 2005/0276919 | A1* | 12/2005 | Truskett ............... G03F 7/0002 427/256 |
| 2006/0062867 | A1 | 3/2006 | Choi et al. |
| 2006/0068120 | A1* | 3/2006 | Sreenivasan .......... B29C 43/003 257/E21.243 |
| 2006/0113697 | A1* | 6/2006 | Sreenivasan .......... B29C 43/021 264/319 |
| 2008/0018875 | A1 | 1/2008 | Schram et al. |
| 2008/0308971 | A1 | 12/2008 | Liu et al. |
| 2009/0214689 | A1 | 8/2009 | Bailey et al. |
| 2010/0098940 | A1 | 4/2010 | Liu et al. |
| 2010/0102487 | A1 | 4/2010 | Schumaker et al. |
| 2010/0109205 | A1 | 5/2010 | Fletcher et al. |
| 2011/0183521 | A1 | 7/2011 | Schmid et al. |
| 2011/0277833 | A1* | 11/2011 | Miller ..................... H01L 31/18 257/E31.127 |
| 2012/0320123 | A1* | 12/2012 | Takeda ................. C09D 11/322 347/21 |
| 2013/0059090 | A1* | 3/2013 | Kawamura ............... B05D 3/12 522/111 |
| 2013/0214452 | A1 | 8/2013 | Choi et al. |
| 2014/0027633 | A1 | 1/2014 | Kuwabara |
| 2014/0160714 | A1 | 6/2014 | Omura |
| 2015/0048050 | A1* | 2/2015 | Sreenivasan ............ B05D 1/34 427/508 |
| 2018/0017862 | A1* | 1/2018 | Ter Meulen ............ B30B 11/20 |

OTHER PUBLICATIONS

Joseph et al., "Fabrication of Self-Aligned Multilevel Nanostructures," Microelectronic Engineering, vol. 169, 2017, pp. 49-61.

Praveen Joseph, "Self-Aligned Integrated Nanostructures Fabricated by UV-Nanoimprint Lithography," Ph.D. Dissertation, The University of Texas at Austin, 2017, pp. 1-164.

Singhal et al., "Inkjet-Based Deposition of Polymer Thin Films Enabled by a Lubrication Model Incorporating NanoScale Parasitics," Physics of Fluids, vol. 25, Issue 9, 2013.

Singhal et al., "Material Dispensing Options for Roll-to-Roll UV Nanoimprint Lithography," 30th Annual Meeting of the American Society for Precision Engineering, Nov. 1-6, 2015, pp. 52-57.

An et al., "Selective Sintering of Metal Nanoparticle Ink for Maskless Fabrication of an Electrode Micropattern Using a Spatially Modulated Laser Beam by a Digital Micromirror Device," ACS Appl. Mater. Interfaces, vol. 6, Issue 4, 2014, pp. 2786-2790.

Shrawan Singhal, "Jet and Coat of Adaptive Sustainable Thin Films," PhD Dissertation, The University of Texas at Austin, Aug. 2012, pp. 1-133.

Romero et al., "Response of Slot Coating Flows to Periodic Disturbances," Chemical Engineering Science, vol. 63, issue 8, Apr. 2008, pp. 2161-2173.

Michael Wayne Lin, "Simulation and Design of Planarizing Materials and Interfacial Adhesion Studies for Step and Flash Imprint Lithography," PhD Dissertation, The University of Texas at Austin, 2008, pp. 1-201.

Written Opinion of the International Searching Authority for International Application No. PCT/US2017/045368 dated Dec. 4, 2017, pp. 1-12.

Snyder et al., "Automated Tuning of High-Order Waveforms for Picoliter Resolution Jetting of Rheologically Challenging Materials," Precision Engineering, 2018, pp. 1-13.

Sreenivasan et al., "Status of UV Imprint Lithography for Nanoscale Manufacturing," Comprehensive Nanoscience and Technology, vol. 4, 2011, pp. 83-116.

Chang et al., "Three Minimum Wet Thickness Regions of Slot Die Coating," Journal of Colloid and Interface Science, vol. 308, Issue 1, 2007, pp. 222-230.

Brian Derby, "Inkjet Printing of Functional and Structural Materials: Fluid Property Requirements, Feature Stability and Resolution," Annual Review of Materials Research, vol. 40, Jun. 2010, pp. 395-414.

Mark Miller, "Intermittent Coating," Presented at the 17th International Coating Science and Technology Symposium, San Diego, California, Sep. 7-10, 2014, pp. 1-6.

Ahn et al., "High Performance Wire-Grid Polarizers Using Jet and Flash Imprint Lithography," J. Micro/Nanolithography, MEMS, and MOEMS, vol. 12, Issue 3, 031104, Jul.-Sep. 2013, pp. 1-9.

Extended European Search Report for European Patent Application No. 17 837 715.6 dated May 4, 2020, pp. 1-9.

International Preliminary Report on Patentability for International Application No. PCT/US2017/045368 dated Feb. 14, 2019, pp. 1-13.

* cited by examiner

ROLL-TO-ROLL PROGRAMMABLE FILM IMPRINT LITHOGRAPHY

CROSS REFERENCE TO RELATED APPLICATIONS

This application claims priority to U.S. Provisional Patent Application Ser. No. 62/370,259, entitled "Programmable Film Imprint Lithography," filed on Aug. 3, 2016, which is incorporated by reference herein in its entirety.

GOVERNMENT INTERESTS

This invention was made with government support under Grant No. ECCS1120823 awarded by the National Science Foundation as well as under Grant No. FA8650-15-C-7542 awarded by the Air Force Research Lab. The U.S. government has certain rights in the invention.

TECHNICAL FIELD

The present invention relates generally to nanoimprint lithography, and more particularly to a roll-to-roll programmable film imprint lithography process using an optimization program to achieve the desired features on the substrate.

BACKGROUND

Nanoimprint lithography is a method of fabricating nanometer scale patterns that is low cost, high throughput and high resolution. The imprint resist is typically a monomer or polymer formulation that is cured by heat or UV light during the imprinting. Adhesion between the resist and the template is controlled to allow proper release.

There are many different variations of nanoimprint lithography. Among all the variants of nanoimprint lithography, Jet and Flash Imprint Lithography (J-FIL) offers distinct advantages in the replication of non-uniform patterns. This is because J-FIL uses drop-on-demand inkjetting as the preferred mode of material deposition, which allows pattern density based adaptive material placement. J-FIL has also been configured for roll-to-roll (R2R) imprinting which combines the benefits of inexpensive R2R processing with the precise nanoscale patterning afforded by J-FIL. Other variants of R2R imprint lithography use gravure or slot-die coating as the mechanism for material deposition and hence print substantially uniform patterns.

The use of inkjetting as the preferred mode for material deposition leads to several challenges with respect to material formulation and dispensing. Apart from these, one of the most important problems that J-FIL needs to overcome is that of bubble trapping. This occurs because of the use of discrete drops in the process, which are merged under the action of the template. This problem is circumvented by the use of an atmosphere of process gases, such as carbon dioxide or Helium or 1,1,1,3,3-pentafluoropropane (PFP); or the use of porous surfaces. However, for large-area printing formats, such as those typically processed in R2R configurations, it may be difficult to cover the entire substrate area, including the center, with the adequate amount of carbon dioxide or Helium before processing, to minimize bubble trapping.

Another problem arises in the printing of non-uniform pattern densities, where it becomes necessary to have non-uniform drop placement that matches with the pattern density variation.

SUMMARY

In one embodiment of the present invention, a method for fabricating patterns on a flexible substrate in a roll-to-roll configuration comprises implementing an inverse optimization scheme to determine process parameters used to obtain a desired film thickness of a liquid resist formulation. The method further comprises covering the flexible substrate in the roll-to-roll configuration with a substantially continuous film of the liquid resist formulation, using one or more of the following techniques: dispensing discrete drops of a monomer on a substrate using an inkjet and allowing the dispensed drops to spontaneously spread and merge to form the substantially continuous film of the liquid resist formulation, slot-die coating, dip coating, gravure coating and knife-edge coating, where the liquid resist formulation is diluted in a solvent on the substrate. The method additionally comprises evaporating the solvent substantially from the liquid resist formulation forming a film. Furthermore, the method comprises closing a gap between a template and the substrate to fill features of the template with the film. Additionally, the method comprises curing the film to polymerize the film. In addition, the method comprises separating the substrate from the template leaving the polymerized film on the substrate.

In another embodiment of the present invention, a method for depositing a film on a flexible substrate held in a roll-to-roll configuration comprises implementing an inverse optimization scheme with a desired film thickness profile as an input which is used to determine process parameters of a liquid resist formulation, where the liquid resist formulation comprises a solvent and one or more non-solvent components. The method further comprises covering the flexible substrate in a roll-to-roll configuration with a substantially continuous film of the liquid resist formulation using one or more of the following techniques: dispensing discrete drops of a monomer on the substrate using an inkjet and allowing the dispensed drops to spontaneously spread and merge, and slot die coating, where the liquid resist formulation is diluted in the solvent. The method additionally comprises evaporating the solvent substantially from the liquid resist formulation forming a film. Furthermore, the method comprises curing the film to polymerize the film.

In a further embodiment of the present invention, a method for performing in-situ metrology on an area of a flexible substrate comprises having an array of Atomic Force Microscope (AFM) tips with individually addressable locations. The method further comprises determining an optimum positioning of the array of AFM tips on the area of the flexible substrate with a pattern, a topography variation or a variation in a film thickness, where each AFM tip in the array of AFM tips provides data that is aggregated to infer the pattern, the topography variation or the film thickness variation. The method additionally comprises scanning the patterned area to measure the pattern, the topography variation or the film thickness variation. Furthermore, the method comprises aggregating and analyzing the measured pattern, the measured topography variation or the measured film thickness variation to infer the pattern, the topography variation or the film thickness variation.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

Figure 1:
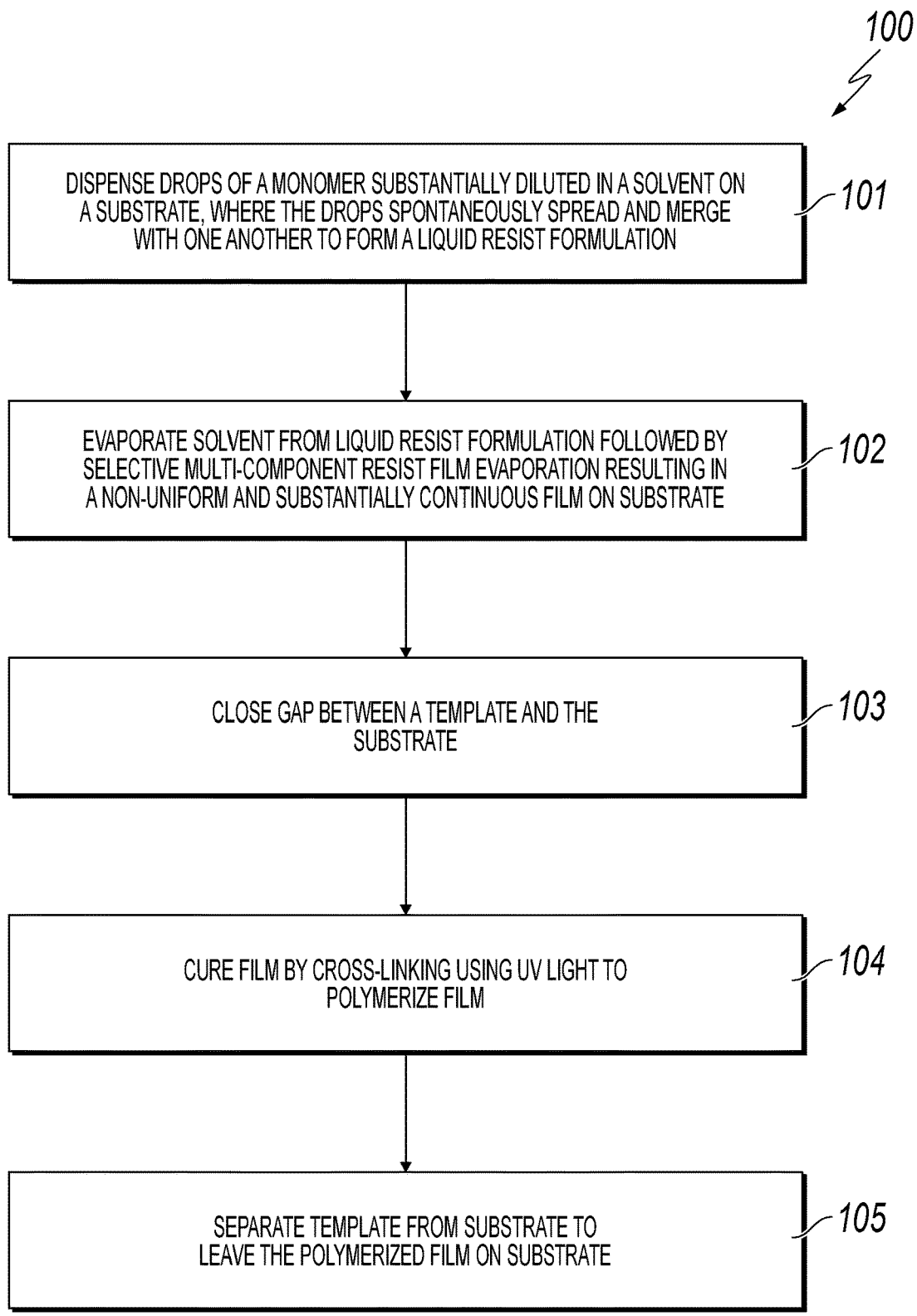
FIG. 1 is a flowchart of a method of the inkjet-based P-FIL (IJ-PFIL) process for fabricating a pattern in accordance with an embodiment of the present invention.

As discussed herein, the principles of the present invention are directed to a novel process called Programmable Film Imprint Lithography (P-FIL). This process is compatible with various modes of material deposition, including inkjetting, slot-die coating, dip-coating, gravure coating and knife-edge coating for coating a film of resist on flexible substrates in a R2R configuration. The thickness of the resist film, just before the patterning step, is substantially continuous and may be non-uniform depending on the given pattern density variations. This non-uniformity may be (i) substantially correlated with an initial non-uniform material distribution or, (ii) can be enhanced from an initial uniform distribution of material through controlled external inputs, such as distributed thermal actuation or controlled gas flow to evaporate the resist film with spatial selectivity or, (iii) a combination of approaches (i) and (ii) discussed herein. In addition, distributed inkjetting of material can be used to add more material selectively on top of films that are deposited using slot-die coating, gravure coating, etc. This may be necessitated in cases where simultaneous patterning of micro- and nano-scale structures is desired. In this case, the thickness of the deposited film may be made compatible with the nano-scale structures, while inkjetting of larger drops may be used to cater to the microscale structures. The achievement of a programmed non-uniform and substantially continuous film is driven by an optimization program that informs the initial material distribution and the nature of external inputs, such as evaporation or gas flow.

In one embodiment, after achieving the desired non-uniform and substantially continuous film on a substrate, the gap between the resist-coated substrate and a patterned template is closed to fill the template pattern. The resist film is then cross-linked using UV light and the template is then separated from the substrate to leave the polymerized resist film on the substrate.

In another embodiment, an intentionally non-uniform film is formed on a pre-patterned substrate or an un-patterned substrate using the methods described above. This is done to compensate for substrate topography variations to achieve a desired final substrate topography. In one embodiment, a goal of the process of the present invention is to deposit an intentionally non-uniform film on a substrate where the resulting top surface has no patterns. Hence, the liquid resist material may be cross-linked in the free surface state or contact may be made against a superstrate that is substantially free from nanoscale and microscale patterns. By covering the top of the liquid film, the superstrate influences the evolution dynamics of the thin film. Its geometry can thus be optimized, by locally changing its thickness, to match the desired film thickness profile and process specifications. In one embodiment, a superstrate thickness profile of the superstrate and geometry are optimized to obtain desired evolution dynamics for a given substrate topography. In one embodiment, the superstrate is flexible or held in a roll-to-roll configuration.

Various embodiments of the P-FIL process are described below with different material deposition methods, where the patterned template results in a pattern on the top of the deposited material.

Furthermore, while the following discusses the present invention in the context of inkjet printing, the principles of the present invention may be practiced using other coating methods as well, such as knife-edge coating, dip-coating, gravure printing, etc. A person of ordinary skill in the art would be capable of applying the principles of the present invention to such implementations. Further, embodiments applying the principles of the present invention to such implementations would fall within the scope of the present invention.

As discussed in the Background section, one of the most important problems that J-FIL needs to overcome is that of bubble trapping. The aforementioned problem of bubble trapping with inkjets can be overcome if larger drops, that are spaced closer together, are used. Such drops may not need the action of the template to merge and form a contiguous film. They may be able to merge spontaneously and form a film that can then be imprinted on. However, the use of a larger resist volume corresponds to thicker residual layers which may be undesirable when the resist pattern needs to be transferred to the underlying films via dry etching or wet etching processes. Moreover, thicker residual layers can lead to problems in residual layer thickness uniformity control which can also lead to sub-optimal pattern transfer after etching. Thus, there is an inherent conflict between the use of higher volume for drop merging and lower volume needed for good etching performance.

One way in which this problem can be overcome is through the use of resist drops that are diluted by solvents. Details of material design are discussed further below. This increases their volume without increasing the monomer content and can thus lead to favorable drop spreading and merging characteristics without using the template to force the formation of a contiguous film in an ambient environment that may not need process gases, such as carbon dioxide, Helium or PFP discussed earlier. Moreover, flexible plastic substrates are inherently porous, thus precluding the use of process gases, such as Helium in the ambient environment to mitigate trapping of air bubbles. These flexible plastic substrates could be used to make nanofabricated components, or as the substrate which has the template pattern for subsequent patterning.

The solvent concentration in the resist formulation cannot be increased arbitrarily, as that might compromise the rheological properties of the resist solution. Also, drops of highly diluted solutions can form fingering instabilities at the edges because of preferential evaporation from the periphery of the drops. Hence, it is important to constrain the material design to prevent the solvent from evaporating substantially in the drop dispensing, spreading and merging stages, as that might compromise with the control of the resist residual layer thickness distribution. Rather, the solvent should be substantially evaporated immediately after merging of the drops to form a continuous film. This would lead to a film with only the desired resist material and with low thickness that may not want to redistribute as much. A flowchart of the inkjet-based P-FIL (IJ-PFIL) process that overcomes the bubble trapping with inkjets is discussed below in connection with FIG. 1.

FIG. 1 is a flowchart of a method 100 of the inkjet-based P-FIL (IJ-PFIL) process for fabricating a pattern in accordance with an embodiment of the present invention. FIGS. 2A-2F depict the cross-sectional views of fabricating a pattern using the steps described in FIG. 1 in accordance with an embodiment of the present invention.

Figure 2A:
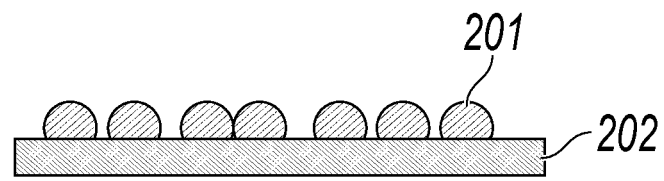
FIGS. 2A-2F depict the cross-sectional views of fabricating a pattern using the steps described in FIG. 1 in accordance with an embodiment of the present invention.
Figure 2B:
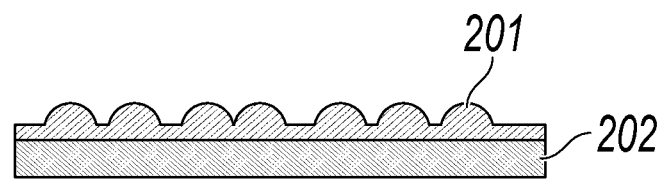
Figure 2C:
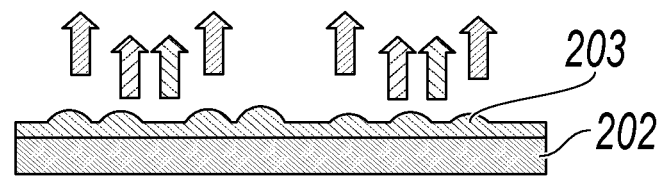

Referring now to FIG. 1, in conjunction with FIGS. 2A-2F, in step 101, drops of a monomer 201 (monomer is substantially diluted in a solvent) are dispensed on a flexible substrate 202 in a roll-to-roll configuration (discussion of roll-to-roll configuration discussed further below) using an inkjet as shown in FIG. 2A, where drops 201 spontaneously spread and merge with one another as shown in FIG. 2B to form a liquid resist formulation 203 (containing the solvent and one or more non-solvent components) as shown in FIG. 2C. In one embodiment, substrate 202 is handled in a roll-to-roll format. In one embodiment, substrate 202 has a pattern. In one embodiment, the inkjet is used to dispense discrete drops of diluted monomer which does not form a substantially continuous film to locally modify film thickness profiles prior to closing the gap between template 205 and substrate 202 (discussed below).

Figure 2D:
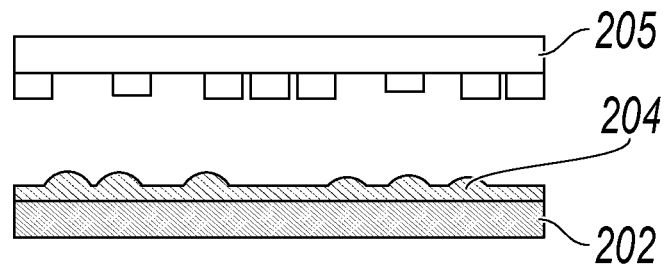

In step 102, the solvent is evaporated (e.g., blanket evaporation) from liquid resist formulation 203 followed by selective multi-component resist film evaporation resulting in a non-uniform and substantially continuous film 204 on substrate 202 as shown in FIGS. 2C and 2D. In one embodiment, the liquid resist formulation consists of solvent with a substantially higher volatility than the rest of the components of the liquid resist formulation. In one embodiment, the non-solvent component(s) of the liquid resist formulation have substantially similar volatility. In one embodiment, the non-solvent component(s) of the liquid resist formulation except for a photoinitiator have a boiling point that differ by less than 30° C., 10° C. or 5° C. In one embodiment, the non-solvent component(s) of the liquid resist formulation except for a photoinitiator have a boiling point in a temperature range of less than 30° C. In one embodiment, the non-solvent component(s) include a thermoset polymer with a high glass transition temperature. In one embodiment, the non-solvent component(s) include silicon or carbon.

In one embodiment, liquid resist formulation 203 is selectively evaporated, such as via infra-red (IR) lamps, forming a non-uniform and substantially continuous film 204 on substrate 202 as shown in FIG. 2D. In one embodiment, the selective evaporation is carried out by one or more of the following: a temperature controlled substrate chuck, an array of individually controllable infrared lamps, an array of individually controllable fans to control air flow, individually controllable micro heaters or coolers on substrate 202, and a spatial light modulator (may include one or more Digital Micromirror Device (DMD) arrays) to control one or more sources of electromagnetic radiation. In one embodiment, the selective evaporation and patterning are carried out in separate stations to avoid recondensation of evaporated materials onto substrate 202 prior to patterning. In one embodiment, the selective evaporation is carried out in an environment with controlled vapor pressures. In one embodiment, the liquid resist formulation, whose solvent has already been evaporated, is selectively evaporated to form film 204 with an intentional thickness profile that leads to a desired thickness profile, where the desired thickness profile is uniform and the intentional thickness profile is non-uniform to compensate for the process parasitics.

In one embodiment, as discussed herein, an inverse optimization scheme may be used to determine process parameters used to obtain a desired film thickness of the liquid resist formulation. In one embodiment, the inverse optimization scheme includes one or more of the following: genetic algorithms, simulated annealing, and full pattern search to achieve an objective function of minimizing an error between a function of the desired film thickness and the obtained film thickness. In one embodiment, the liquid resist formulation, whose solvent has already been evaporated, is selectively evaporated to form film 204 with an intentional thickness profile that leads to a desired thickness profile, where the desired thickness profile is uniform and the intentional thickness profile is non-uniform to compensate for process parasitics. In one embodiment, the selective evaporation is carried out by one or more of the following: a temperature controlled substrate chuck, an array of individually controllable infrared lamps, an array of individually controllable fans to control air flow, individually controllable micro heaters or coolers on substrate 202, and a spatial light modulator (may include one or more Digital Micromirror Device (DMD) arrays) to control one or more sources of electromagnetic radiation. In one embodiment, the solvent evaporation, selective resist evaporation and imprinting are carried out in stations that may be separated by barriers that prevent vapor transport between the stations. In one embodiment, the selective evaporation is carried out in an environment with controlled vapor pressures. In one embodiment, there is a stack of film(s) used between the liquid resist formulation and substrate 202 that substantially absorbs electromagnetic radiation.

In one embodiment, after solvent evaporation, the control of resist film evaporation can be done in a separate station, which is physically separated with barriers, through judicious control of temperature through a distributed set of thermal actuators, infrared (IR) lamps, or combinations thereof, in which each element in the set can be individually controlled. This individual control in infra-red (IR) lamps, for example, can be achieved through devices, such as Digital Micromirror Device (DMD) Arrays from Texas Instruments. A state-of-the-art array has 4M pixels at a pitch of 7.6 micrometers at a diagonal width of 0.9 inches. This can enable spatial modulation of IR intensity to control the evaporation over at least an area of ~0.4 sq. inch. With the appropriate reduction optics, a larger area can be projected upon, but by compromising resolution. As an example, a resist formulation containing methyl methacrylate (MMA) as the liquid monomer and primary component, would need a local heat source of ~1 W to absorb sufficient heat at normal temperature and pressure to evaporate ~100 nm of liquid film from a local 50×50 $\mu m^2$ area, assuming the starting film thickness is 500 nm. Such powers can be delivered using DMD arrays. These devices also have frame rates approaching 10 kHz, and thereby provide high frequency temporal control of the incident radiation and subsequent evaporation.

Additionally, multiple DMD arrays can be used across a larger area, if resolution cannot be compromised further. The individual pixels may have significant cross-talk, which can also be modeled and incorporated in the forward model for thin film evaporation. Additionally, an underlying substrate with MEMS-based micro-heaters may also be used for enhanced temperature distribution, if a higher resolution is required than what can be afforded by the DMD arrays. This principle of selective heating can be generally applied to all embodiments of the present invention and is not specific to only IJ-PFIL.

Figure 2E:
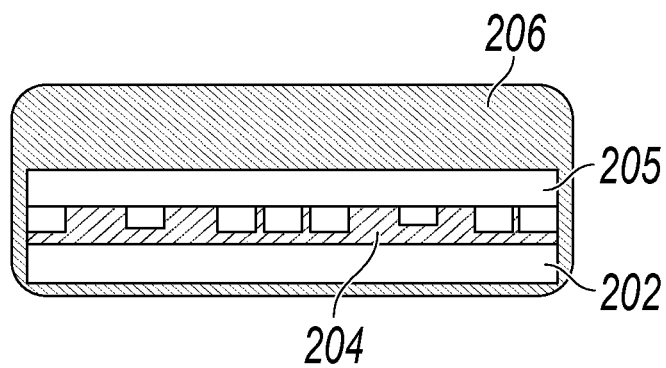

After selective heating and achievement of the desired resist film thickness, a gap between template 205 (e.g., unpatterned template) and substrate 202 is then closed (bringing corresponding template 205 in contact with film 204) in step 103 as shown in FIGS. 2D and 2E such that film 204 fills the features of template 205. In one embodiment, template 205 is patterned with a lateral feature dimension of less than 500 nm. In one embodiment, template 205 is patterned with a lateral feature dimension of less than 100 nm. In one embodiment, the template consists of a three-dimensional shape or a multi-tiered pattern as discussed in P. Joseph et al., "Fabrication of self-aligned multilevel nanostructures," Microelectronic Engineering, 169(5), 2017 and in Praveen Joseph, "Self-Aligned Integrated Nanostructures Fabricated by UV-Nanoimprint Lithography," Ph.D. Dissertation, The University of Texas at Austin, 2017, which are incorporated by reference herein in their entirety. In one embodiment, contact between the substrate and the template is initiated substantially along a line or substantially at a point. This is done to prevent substantial area contact, as it can potentially lead to trapping of bubbles and voids because of the flexible nature of the substrate. In one embodiment, precise motion control and/or force control is employed while closing the gap to prevent impact between the template and the substrate. Impact and high contact pressures can lead to distortion of nanoscale features. Moreover, the exact location of the substrate plane is not known with high precision when the substrate is held in a roll-to-roll configuration under tension. This uncertainty in the location of the substrate plane requires precise detection of contact through accurate calibration of forces, which can be done through force sensors. In one embodiment, substantial line or point contact is enabled by either keeping the surface of the substrate and the template convex, or by having one surface concave and the other convex with a higher radius of curvature. In one embodiment, contact between the template and roll-to-roll substrate is enabled along a line where the substrate is supported by an idle roller or on a chuck with substantially low friction. Materials, such as Diamond-like Carbon (DLC), can be used for this purpose as they are effective solid-phase lubricants. Substantial contact of the substrate against the roller or a chuck can be enabled by keeping the remaining roll-to-roll substrate path at a level lower than the roller or chuck. In one embodiment, the chuck is an air cavity chuck as discussed in U.S. Pat. Nos. 6,982,783; 7,019,819 and 6,980,282, which are incorporated by reference herein in their entirety.

In step 104, resist film 204 is cured by cross-linking using UV light 206 so as to polymerize resist film 204 as shown in FIG. 2E.

Figure 2F:
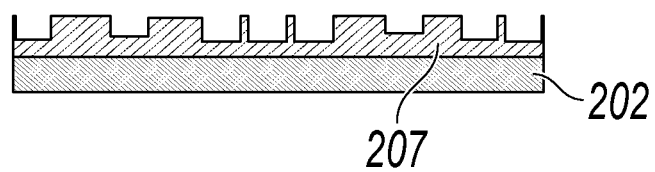

In step 105, template 205 is separated from substrate 202 to leave the polymerized resist film 207 on substrate 202 as shown in FIG. 2F.

In one embodiment, the tension in substrate 202 is controlled to substantially mitigate distortions because of thermal expansion.

Figure 3:
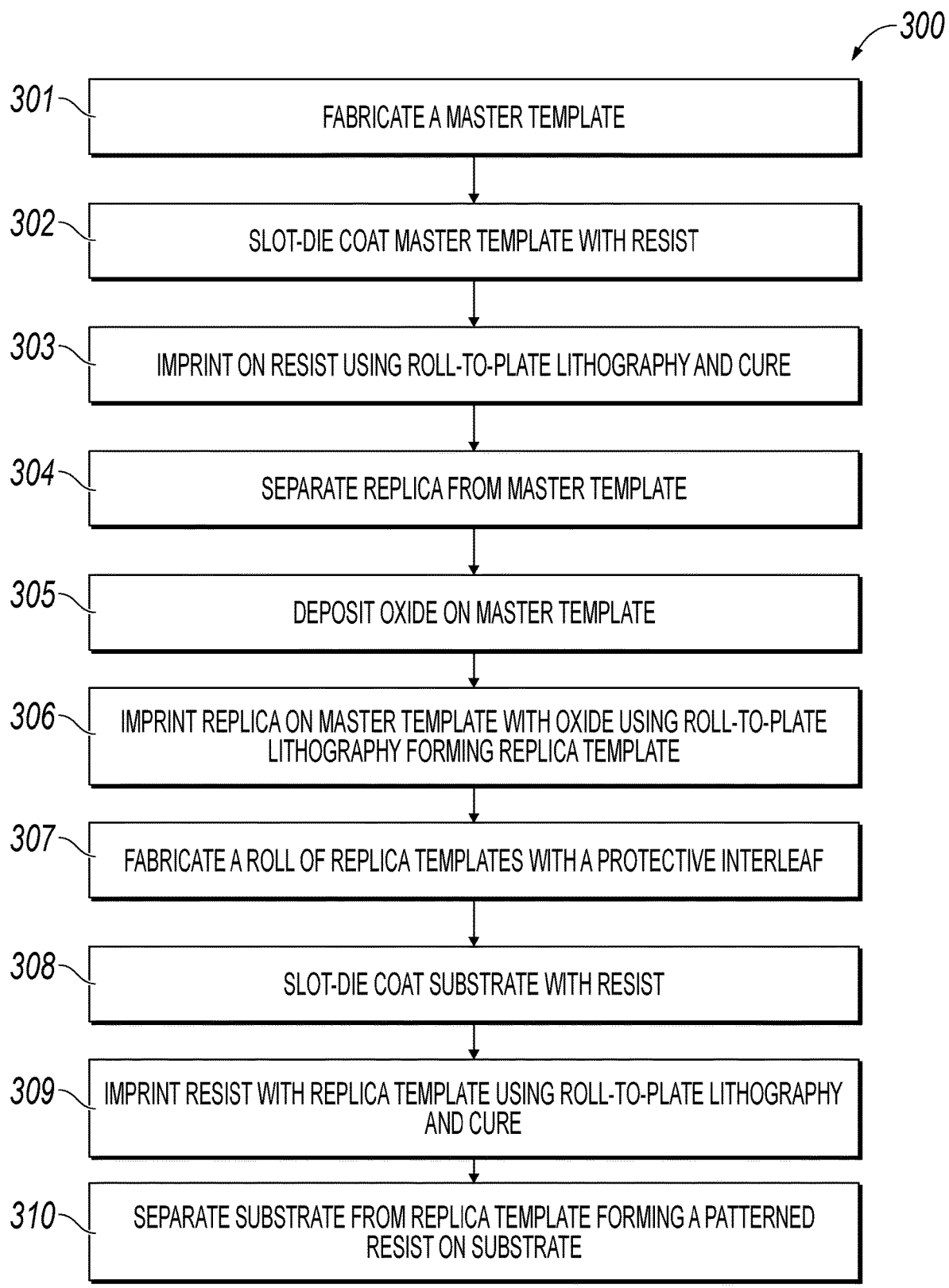
FIG. 3 is a flowchart of method for fabricating replica templates and final substrates using roll-to-plate lithography in accordance with an embodiment of the present invention.

In one embodiment, template 205 has a multi-tiered pattern and/or a three-dimensional shape. In one embodiment, template 205 is flexible or held in a roll-to-roll configuration. This template configuration can be realized after substrate 202 is patterned using a rigid template 205, and can be used to pattern large-area substrates, such as glass panels, as discussed in U.S. Pat. No. 9,616,614, which is incorporated by reference herein in its entirety. In general, a roll-to-roll PFIL approach can support both roll-to-roll and roll-to-plate (R2P) lithography. The former involves having both the template and the substrate held in roll-to-roll configurations, while the latter has one of the two held in a roll-to-roll configuration with the other being a rigid substrate, such as a wafer or a glass panel. In one embodiment, the substrate is assumed to be held in a roll-to-roll configuration while the template is rigid. In one embodiment, the substrate is flexible. An example of roll-to-plate lithography to make replica templates, and final substrates, is provided in FIGS. 3 and 4A-4J. FIG. 3 is a flowchart of method 300 for fabricating replica templates and final substrates using roll-to-plate lithography in accordance with an embodiment of the present invention. FIGS. 4A-4J depict the cross-sectional views of fabricating replica templates and final substrates using the steps described in FIG. 3 in accordance with an embodiment of the present invention.

Figure 4A:
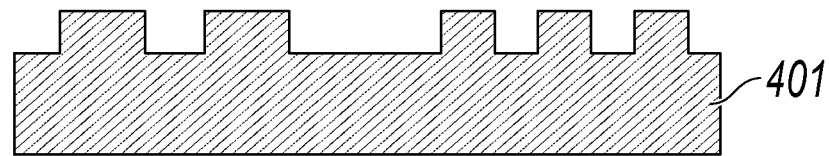
FIGS. 4A-4J depict the cross-sectional views of fabricating replica templates and final substrates using the steps described in FIG. 3 in accordance with an embodiment of the present invention.

Referring to FIG. 3, in conjunction with FIGS. 4A-4I, in step 301, a master template 401 is fabricated, such as using e-beam, photolithography, etc., as shown in FIG. 4A.

Figure 4B:
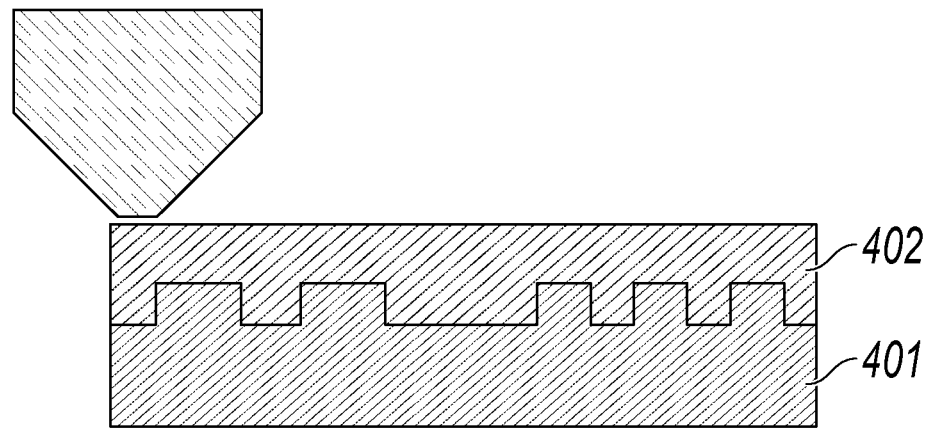

In step 302, master template 401 is slot-die coated with resist 402 as shown in FIG. 4B.

Figure 4C:
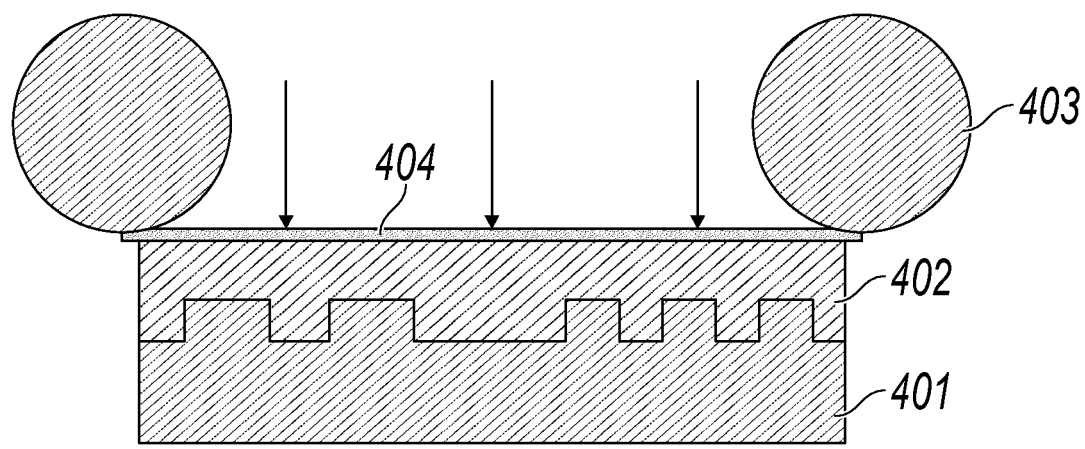
Figure 4D:
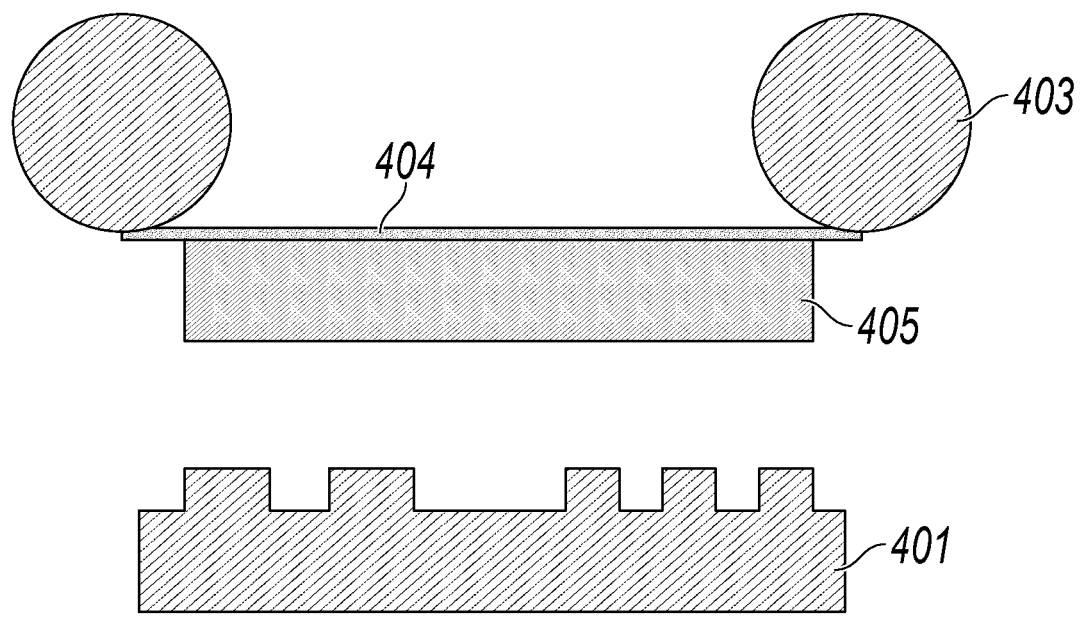

In step 303, imprint on resist 402 using roll-to-plate (R2P) lithography (imprint rollers 403, plate 404) and cure forming replica 405 as shown in FIGS. 4C and 4D.

In step 304, replica 405 is separated from master template 401 as shown in FIG. 4D and the process is repeated (steps 302-304) to fabricate further replicas 405.

Figure 4E:
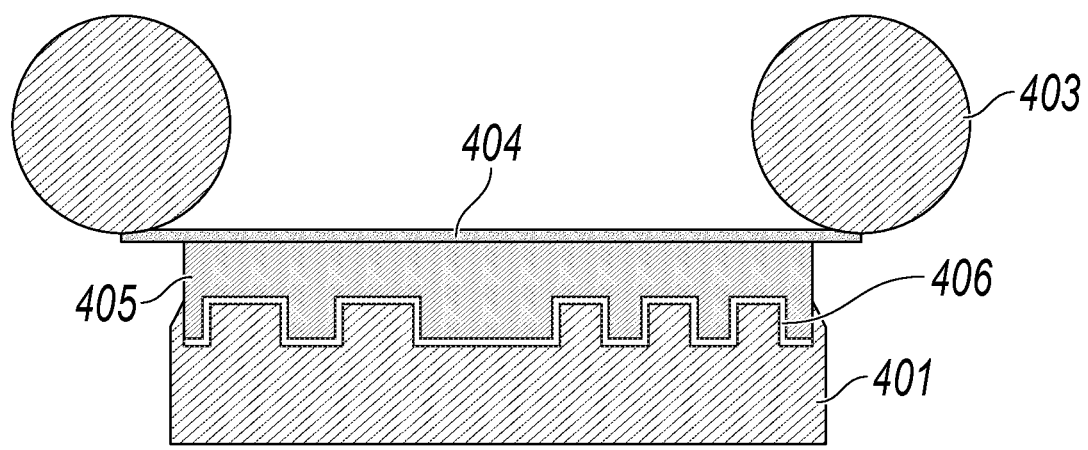

In step 305, oxide 406 is deposited on master template 401 as shown in FIG. 4E.

Figure 4F:
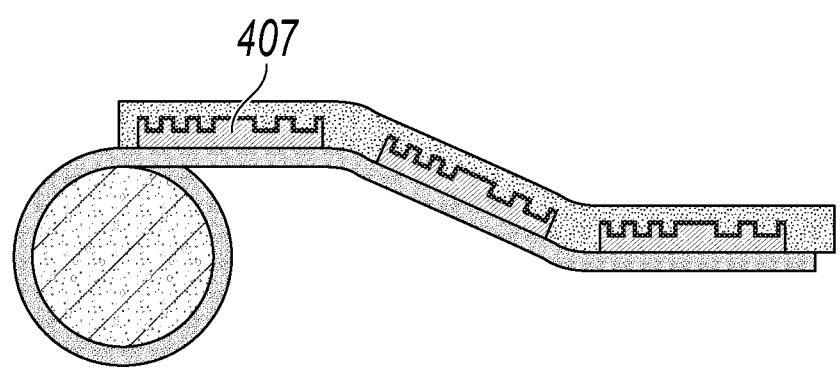

In step 306, replica 405 is imprinted (R2P) on master template 401 with oxide 406 forming replica template 407 as shown in FIGS. 4E and 4F.

Step 306 is repeated to fabricate a roll of replica templates 407 with a protective interleaf as shown in FIG. 4F.

Figure 4G:
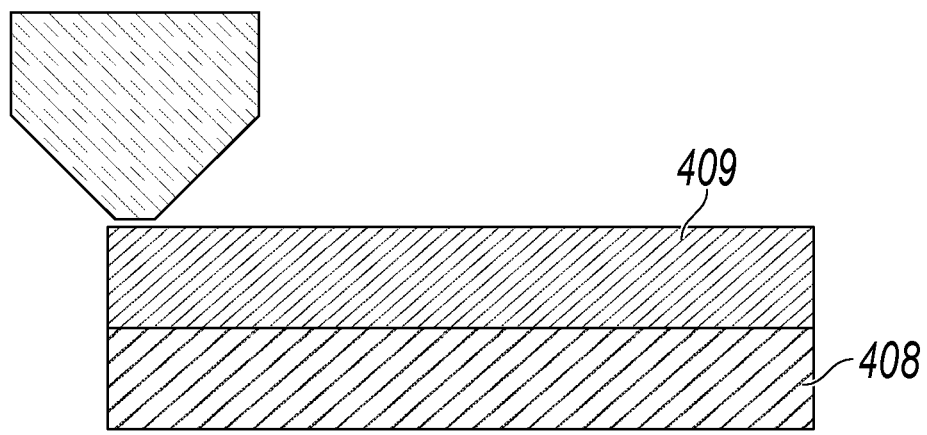

In step 307, a substrate 408 is slot-die coated with resist 409 as shown in FIG. 4G. In one embodiment, substrate 408 is flexible and/or held in a roll-to-roll configuration thereby enabling R2R lithography.

Figure 4H:
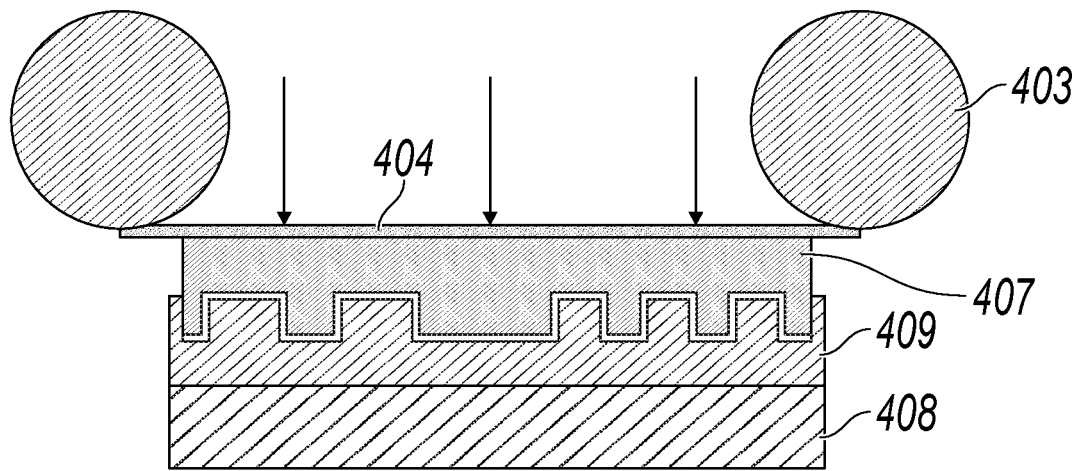

In step 308, resist 409 is imprinted (R2P) using replica template 407 and cured as shown in FIG. 4H.

Figure 4I:
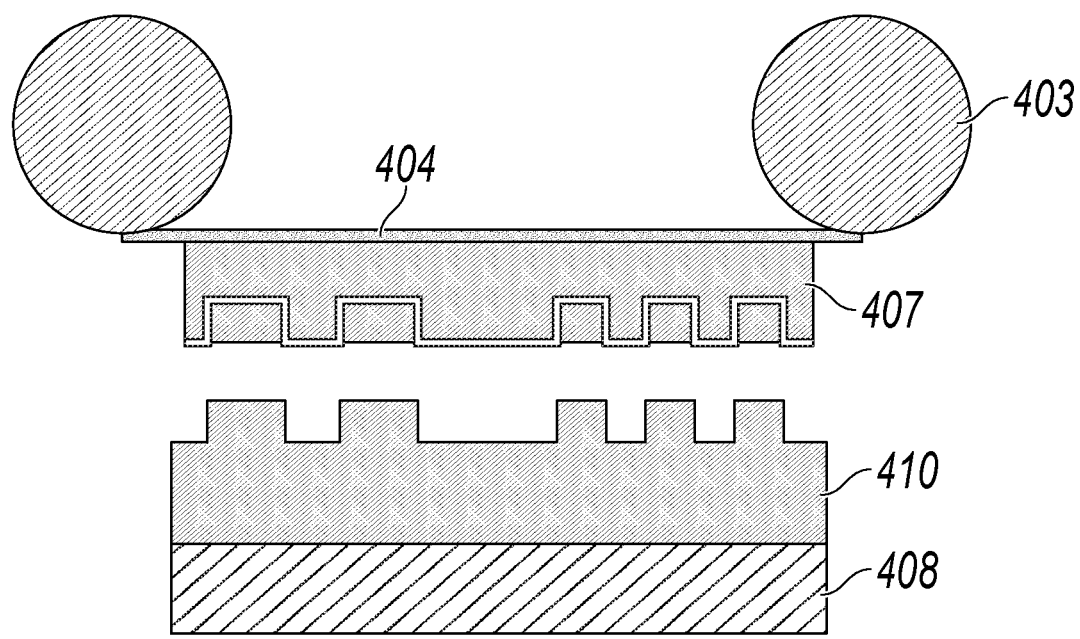
Figure 4J:
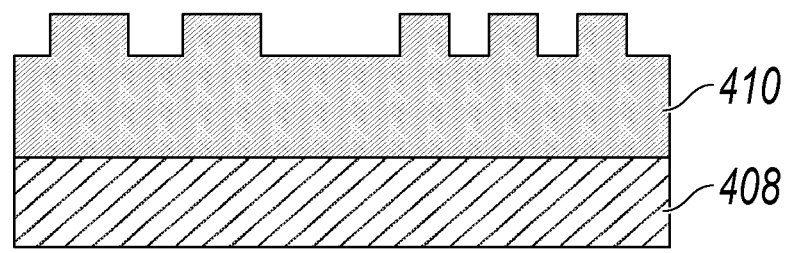

In step 309, substrate 408 is separated from replica template 407 forming a patterned resist 410 on substrate 408 as shown in FIGS. 4I and 4J.

In one embodiment, the evaporation and patterning are carried out in separate stations.

Figure 5:
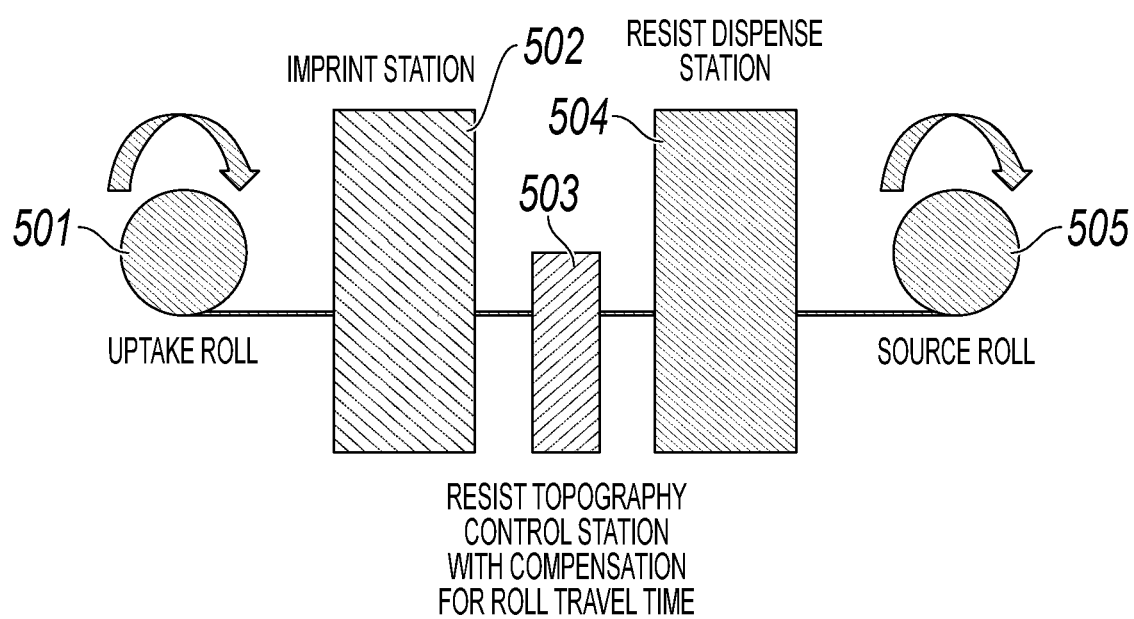
FIG. 5 illustrates the roll-to-roll (R2R) configuration in accordance with an embodiment of the present invention.

In one embodiment, different tool locations may be used in method 100 (IJ-PFIL), such as in the roll-to-roll (R2R)

configuration as illustrated in FIG. 5 in accordance with an embodiment of the present invention. Referring to FIG. 5, in the R2R configuration, there is an uptake roll 501, an imprint station 502, a resist topography control station 503 that compensates for total travel time, a resist dispense station 504 and a source roll 505.

Furthermore, while method 100 can potentially overcome problems with bubble trapping, it can be further enhanced by the use of an inverse model to also address varying template pattern geometry to determine optimum drop locations and volumes, along with DMD array parameters, such as the spatial and temporal distribution of mirrors to open and close. The inverse model should be wrapped around a forward model that takes into account thin film flow in the presence of evaporation and surface tension driven gradients for the drop spreading, merging and evaporation stages prior to imprinting. The inverse optimization scheme is used to determine process parameters, such as inkjet drop volume, location and evaporation temperature profile. In one embodiment, the inverse optimization scheme uses genetic algorithms, simulated annealing and/or a full pattern search to achieve an objective function of minimizing an error between a function of the desired film thickness and the obtained film thickness. In one embodiment, automatic machine in a loop control is achieved using genetic algorithms, simulated annealing and/or a full pattern search. In one embodiment, the inverse model may also include parameters of the Digital Micromirror Device (DMD) array, for example, the spatial distribution and frequency of switching of individual mirrors, to control the spatial evaporation profile. In one embodiment, the inverse optimization scheme may be augmented to determine one of the following: a spatial evaporation profile, a spatial temperature profile, a spatial material removal profile, a spatial evaporation rate profile, and a spatial material removal rate profile. A framework for this optimization scheme is shown in FIG. 6.

Figure 6:
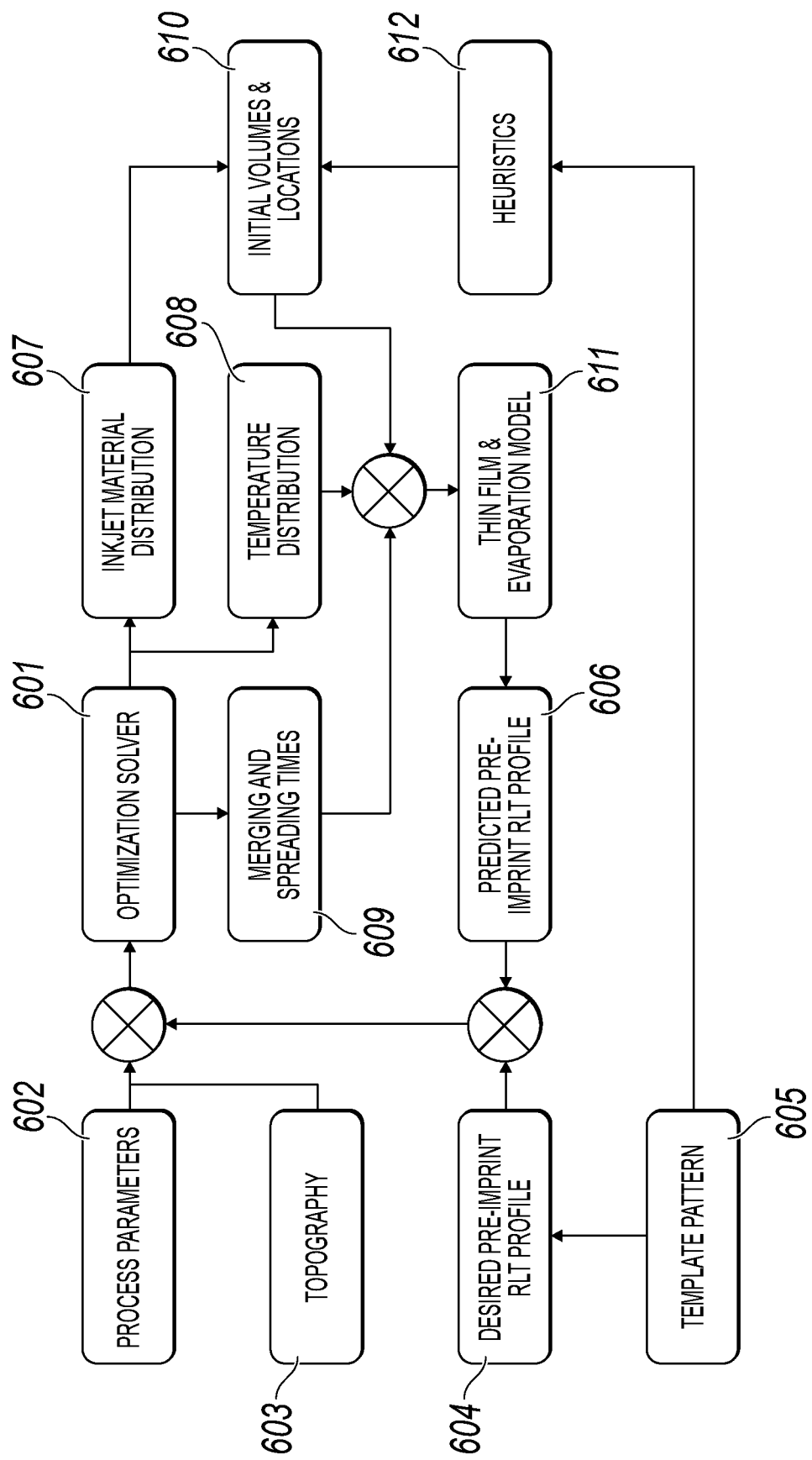
FIG. 6 is a diagram of the framework for the inverse optimization scheme for IJ-PFIL in accordance with an embodiment of the present invention.

FIG. 6 is a diagram of the framework for the inverse optimization scheme for IJ-PFIL in accordance with an embodiment of the present invention.

Referring to FIG. 6, optimization solver 601 receives as inputs, the process parameters 602, topography 603, a desired pre-imprint residual layer thickness (RLT) profile 604, which uses the template pattern 605 as an input, and a predicted pre-imprint RLT profile 606.

Optimization solver 601 outputs the inkjet material distribution 607, temperature distribution 608 and merging and spreading times 609. The initial volumes and locations 610, which receives as input, the inkjet material distribution 607, as well as temperature distribution 608 and merging and spreading times 609 are inputs to the thin film and evaporation model 611 which is inputted to predicted pre-imprint RLT profile 606.

Furthermore, template pattern 605 is inputted to heuristics 612 which is inputted to initial volumes and locations 610.

In one embodiment, such an inverse optimization scheme is implemented by a computing system.

It is noted that any deviations in drop volume in the drop dispense stage can be overcome through image-processing based drop volume and velocity control. The inverse model for determining optimum drop volumes and locations can also leverage prior work from Sreenivasan et al. (U.S. Patent Application Publication No. 2015/0048050), which is incorporated by reference herein in its entirety. Ideally, the boiling point of the solvent should be much lower than the rest of the resist components, such that there is minimal evaporation of the resist when evaporating the solvent. For example, the boiling point of the XNIL-265F resist from MicroResist Technologies is close to 180° C., whereas, the boiling point of a common solvent, such as PGMEA, is close to 140° C. This selective evaporation of the resist material can enable a desired film thickness profile, based on the need to obtain a uniform residual layer in the presence of non-uniform patterns, or address substantially systematic process parasitics, such as non-uniform shrinkage upon cross-linking and non-uniform etch rates in etch tools. The film thickness profile can also be used to obtain a desired functional performance, such as desired optical performance, mechanical stability, etc. Moreover, the film thickness profile can also be used to obtain an intentional non-uniform residual layer, which would effectively result in controlled non-uniform feature dimensions for a uniform template pattern, as an example. This variation in feature dimensions across the field can result in interesting nanophotonic properties.

In one embodiment of the P-FIL process, slot die coating based P-FIL (SD-PFIL) is the material deposition technique. Slot-die coating is an inexpensive process that has been used traditionally for R2R processing of flexible substrates. The challenge with slot-die coating is that it is extremely difficult to obtain nanoscale wet films of the thickness desired for nanoscale imprint lithography process residual layer films that have a mean thickness of less than 50 nm.

Like IJ-PFIL, here, too, the material can be substantially diluted using solvents. Details of material design are discussed further below. Thus, the resist material concentration can be minimized to reduce the waste of expensive material. During execution of the slot die coating process and baking step, almost all of the solvent evaporates leading to a thin film of monomer resist with little or no concentration of solvent. This evaporation during the slot-die coating process can also be affected by the air flow in the vicinity. Unlike IJ-PFIL, where the initial material distribution can be controlled to get an initially non-uniform film, in SD-PFIL, the coated film immediately after slot-die coating is substantially uniform in at least one dimension. However, regardless of uniformity, there is a combination of process parameters that leads to a desired mean film thickness after slot-die coating. Other than the material rheology, these control parameters include speed of the substrate relative to the die and coating gap. Thus, the inverse model can be used to obtain optimum values for these parameters to obtain an initial uniform thick film that can then be driven to non-uniformity using controlled evaporation of the remaining resist in a separate station. The inverse model can also be used for determining DMD parameters, such as the spatial and temporal distribution of "on" and "off" mirrors. Moreover, the relation between these parameters and the film thickness can be quite complex to model. This is because the relation depends on the "region of operation" of the slot-die coater. Typically, it would be preferred to have the coater operate in the so-called "region III," where the wet film thickness decreases with increasing speed, leading to favorable throughput. However, there might be situations where the material rheology may constrain the operation to only outside this region. Hence, the inverse model may be augmented with heuristics to determine an optimum set of values.

At the same time, it should be ensured that the evaporating solvent is completely evaporated and exhausted before the substrate is carried to the patterning station. Any residual solvent, either on the substrate or in the vapor phase, can create problems with voids, feature collapse or parasitic condensation on the patterned resist. A framework for inverse optimization in the SD-FIL process is shown in FIG.

7. In one embodiment, the inverse optimization scheme is used to determine process parameters, such as inkjet drop volume, location and evaporation temperature profile, with an input being substrate topography. In one embodiment, the inverse optimization scheme uses genetic algorithms, simulated annealing and/or a full pattern search to achieve an objective function of minimizing an error between a function of a desired film thickness and said obtained film thickness. In one embodiment, automatic machine in a loop control is achieved using genetic algorithms, simulated annealing and/or a full pattern search.

Figure 7:
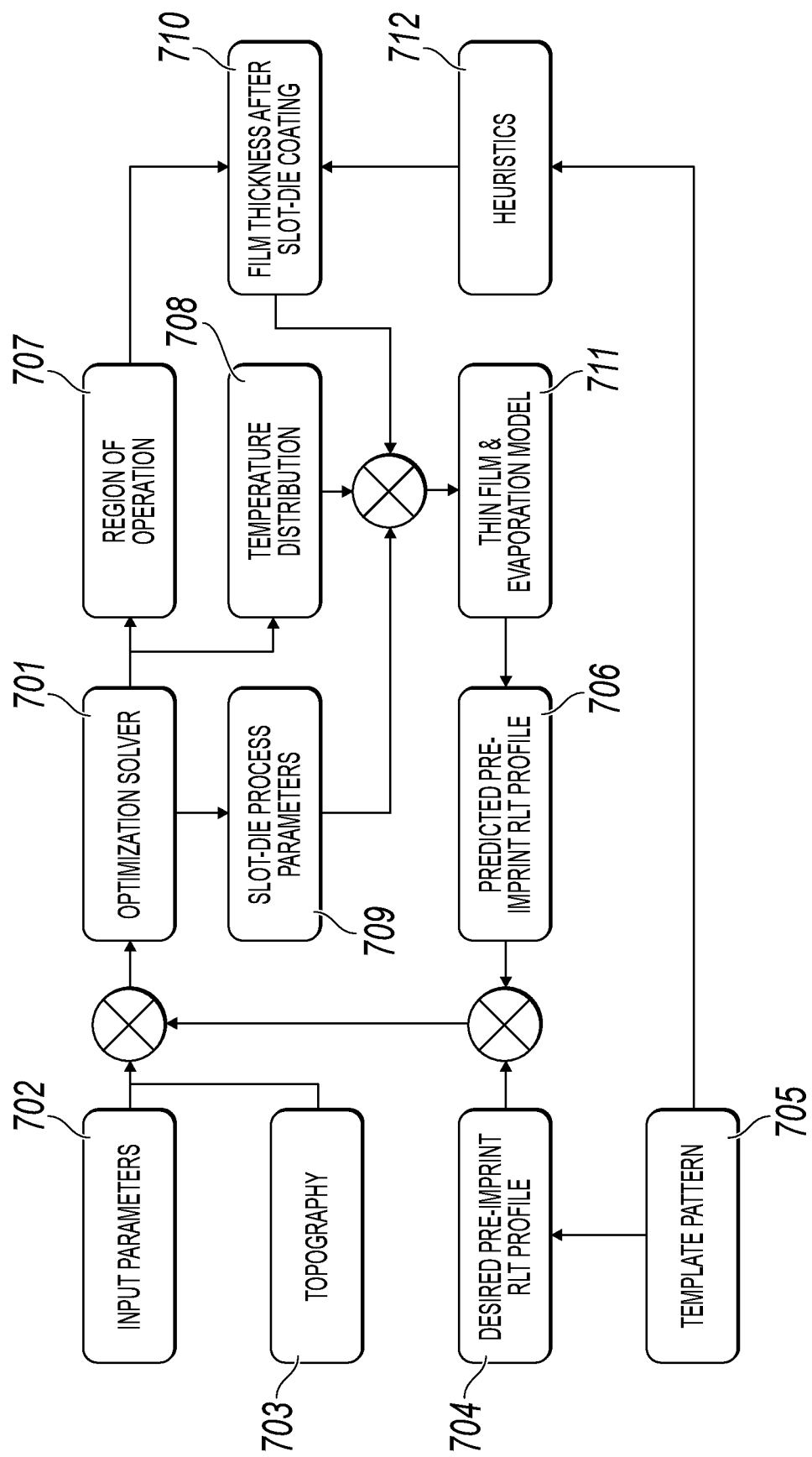
FIG. 7 is a diagram of the framework for the inverse optimization scheme for Slot-die (SD)-PFIL in accordance with an embodiment of the present invention.

FIG. 7 is a diagram of the framework for the inverse optimization scheme for SD-PFIL in accordance with an embodiment of the present invention.

Referring to FIG. 7, optimization solver 701 receives as inputs, the input parameters 702, topography 703, a desired pre-imprint residual layer thickness (RLT) profile 704, which uses the template pattern 705 as an input, and a predicted pre-imprint RLT profile 706.

Optimization solver 701 outputs the region of operation 707, temperature distribution 708 and slot-die process parameters 709. The film thickness after slot-die coating 710, which receives as input, the region of operation 707, as well as temperature distribution 708 and slot-die process parameters 709 are inputs to the thin film and evaporation model 711 which is inputted to predicted pre-imprint RLT profile 706.

Furthermore, template pattern 705 is inputted to heuristics 712 which is inputted to film thickness after slot-die coating 710.

In one embodiment, such an inverse optimization scheme is implemented by a computing system.

The control of resist evaporation can be done through judicious control of temperature through a distributed set of thermal actuators, IR lamps, or combinations thereof, in which each element in the set can be individually controlled. This individual control in IR lamps, for example, can be achieved through devices, such as Digital Micromirror Device (DMD) Arrays from Texas Instruments. A state-of-the-art array has 4M pixels at a pitch of 7.6 micrometers at a diagonal width of 0.9 inches. This can enable spatial modulation of IR intensity to control the evaporation over at least an area of ~0.4 sq. inch. With the appropriate reduction optics, a larger area can be projected upon, but by compromising resolution. As an example, a resist formulation containing methyl methacrylate (MMA) as the liquid monomer and primary component, would need a local heat source of ~1 W to absorb sufficient heat at normal temperature and pressure to evaporate ~100 nm of liquid film from a local 50×50 $\mu m^2$ area, assuming the starting film thickness is 500 nm. Such powers can be delivered using DMD arrays. These DMD arrays can also support switching frequencies approaching 10 kHZ thereby providing high frequency pulses of radiation.

Additionally, multiple DMD arrays can be used across a larger area, if resolution cannot be compromised further. Compensation of any process parasitics resulting from sequential processing under different DMD arrays can be incorporated in the inverse optimization framework. In one embodiment, the inverse optimization framework compensates for sequentially selective evaporation from one or more DMD arrays, or temperature profiles resulting from heat capacity of the substrate or material, or deterministic changes in film thickness profile due to known changes in ambient conditions or when handling or transporting the substrate. In one embodiment, the individual pixels may also have significant cross-talk, which can also be modeled and incorporated in the forward model for thin film evaporation. Additionally, an underlying substrate with MEMS-based micro-heaters may also be used for enhanced temperature distribution, if a higher resolution is required than what can be afforded by the DMD arrays. In one embodiment, the starting material can be substantially free from the solvent and may only consist of the resist (e.g., XNIL26-SF resist from MicroResist Technologies). The approach presented herein uses controlled resist evaporation thereby removing a portion of the resist that is to be cross-linked. This selective evaporation of the resist material can enable a desired film thickness profile, based on the need to obtain a uniform residual layer in the presence of non-uniform patterns, or address substantially systematic process parasitics, such as non-uniform shrinkage upon cross-linking, and non-uniform etch rates in etch tools. The film thickness profile can also be used to obtain a desired functional performance, such as desired optical performance, mechanical stability, etc. Moreover, the film thickness profile can also be used to obtain an intentional non-uniform residual layer, which would effectively result in controlled non-uniform feature dimensions for a uniform template pattern, as an example. This variation in feature dimensions across the field can result in interesting nanophotonic properties.

When a resist mixture is partially evaporated in this manner, it is desirable that the relative boiling points of all the components of the resist are substantially the same, for example, within 10° C. of each other, to ensure the resist mixture remains consistent in its properties; and it is desirable to not include a solid monomer material as a component of the monomer mixture. For planarization, however, the material design may involve additional considerations. Details of material design are discussed further below.

Concerning modeling, a general forward model is now discussed. The flow of a fluid in domains that have much smaller thickness than lateral length scales are adequately described by the lubrication approximation. For Marangoni, i.e., surface tension gradient, driven flows in the presence of evaporation, the lubrication approximation leads to the following equation:

$$\frac{\partial h}{\partial t} + \frac{\partial}{\partial x}\left\{\frac{h^3}{3\mu}\left[\gamma\frac{\partial^3 h}{\partial x^3} + \frac{\partial}{\partial x}\left(\frac{J^2}{\rho_v}\right)\right] + \frac{h^2}{2\mu}\frac{\partial \gamma}{\partial x}\right\} = -\frac{J}{\rho_l}$$

where h=film thickness, t=time, x=spatial co-ordinate, $\mu$=viscosity, $\gamma$=surface tension, J=mass flux across interface, $\rho_l$=liquid density, $\rho_v$=vapor density. In this equation, temperature controls the viscosity, surface tension, densities as well as the mass flux across the interface. In general, these properties are dependent on the material design and often involve a trade-off. For example, resist materials diluted by solvent have lower viscosity than those that are undiluted, as seen in the XNIL26 family of resists from MicroResist Technologies. However, the diluted materials are also more volatile. Hence, this equation can be used to derive desirable material properties to achieve a desirable process time scale.

In addition, a linear stability analysis needs to be conducted for this equation to determine the influence of temperature. One goal is to understand if a uniform film would remain uniform, and how any non-uniformities would develop with parametric variation in fluid properties as well as film thickness and temperature profiles. In addition to evaporation, other dispersion and mixing characteristics may also be exploited to further influence thin film evolution.

Preliminary understanding of thin film flows in the presence of evaporation and surface tension gradients can be understood with the help of a linear stability analysis. Work done in the literature suggests that, for diffusion-limited flows, i.e., flows in which the local ambient is saturated with the vapor near the interface and evaporation is limited by diffusion of the vapor, any local film thickness perturbations are damped. This implies that non-uniform films will tend to become uniform in the absence of local substrate topography. On the other hand, for transfer-limited flows, i.e., flows in which there is advection at the interface that prevents the vapor from being saturated at the interface, the flow is unstable. This implies that troughs and valleys get amplified, which renders the film increasingly non-uniform. In the context of a PFIL process, both these situations can be potentially exploited. The diffusion-limited case would likely offer stable control of the film thickness variations in initially non-uniform films, such as in IJ-PFIL. But, the transfer-limited case can be used to generate non-uniformities that can enable filling of directional patterns, or in SD-PFIL, where the initial film is substantially uniform. However, in both these cases, the exact time scales are important, which can be found through a thorough analysis of typical process parameters.

A model enhancement for IJ-PFIL is now discussed.

Figure 8:
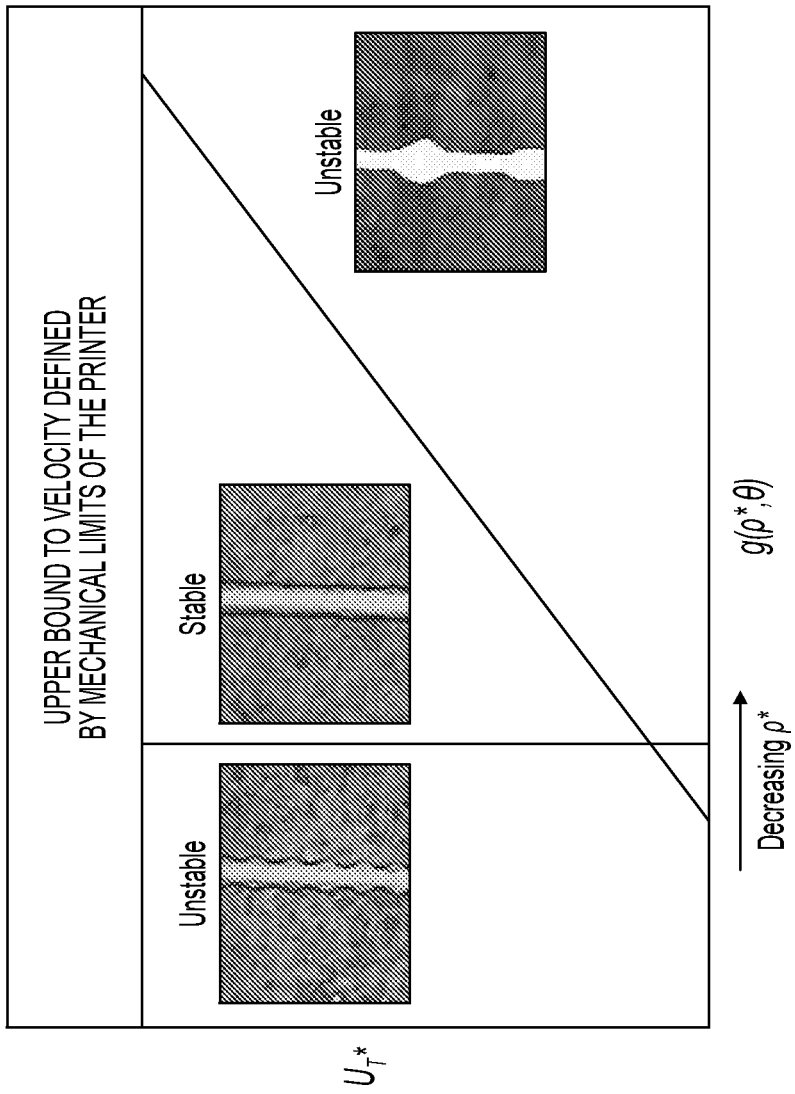
FIG. 8 illustrates a stable bead formation in accordance with an embodiment of the present invention.

Because the resist solution is assumed to be highly wetting, the above lubrication model holds for both individual drops as well as multiple drops that have merged to form a film. However, the boundary conditions for the case with only a single drop or very few merged drops are much more complex than the case where several thousands of drops have merged to form a contiguous film. This is also because of random perturbations that can change film thickness, pressure or temperature conditions. Hence, for the stages of drop spreading and merging, results from this model can be complemented with experimental heuristics to drive the inverse optimization scheme. The use of heuristics can also help with highly directional patterns. For example, in the domain of inkjet printing, uniform width lines are routinely formed by merging multiple drops. A stability criterion has been established to determine when such lines are stable and when they lead to defects, as shown in FIG. 8. Such heuristics can be used to tweak drop pitch to enable stable film formation, assuming there is no evaporation in the spreading and merging stages. Moreover, for directional patterns, the process can be repeated after solvent evaporation, to get defined stable lines over the continuous film that are parallel to the directionality of the pattern.

Referring now to FIG. 8, FIG. 8 illustrates a stable bead formation in accordance with an embodiment of the present invention. The x-axis of FIG. 8 is a function of drop spacing and contact angle, while the y-axis is a function of printhead velocity and fluid material properties.

A model enhancement for SD-PFIL is now discussed. Although the slot-die coating process primarily offers uniform films, there is evidence in the literature to suggest transient control of the slot-die coating process. The first is a conference presentation (Mark Miller, "Intermittent Coating," Presented at the 17th International Coating Science and Technology Symposium) on intermittent slot die coating, i.e., slot die coating of rectangular patches with multiple start-stop transitions without defects, and shows that there are a number of parameters that need to be controlled to maintain defect-free stop and start of coating. The second is a journal article (Romero et al., "Response of Slot Coating Flows to Periodic Disturbances," Chemical Engineering Science, Volume 63, Issue 8, April 2008, Pages 2161-2173, ISSN 0009-2509, http://dx.doi.org/10.1016/j.ces.2008.01.012) where the authors have conducted a perturbation analysis for the final wet film thickness on coating gap and upstream pressure variations. They report that the wet film thickness variation has a phase shift from the coating gap variation. The film thickness variation amplitudes are usually damped, but at high perturbation frequencies (~1 KHz), there can be high-amplitude oscillations in the wet film thickness. Thus, it is important to capture the effect of these transients so that they can be used effectively for local film thickness management, which may become important if a substantially uniform film may not lead to the desired non-uniform film at the end of the downstream controlled evaporation step. However, it is important to note that in the direction parallel to the die, there is little scope for varying the film thickness beyond what is physically possible given the die geometry.

The slot-die coating process, too, can benefit from a prior experimental determination of the process window that can be used to augment the model in the form of heuristics, which can also drive tweaking of the film thickness profile to accommodate directional patterns on the template.

A discussion regarding the metrology and feedback for process optimization is now deemed appropriate. In one embodiment, the present invention uses an in-line metrology to provide feedback (e.g., visual, optical, electro-magnetic, thermal) for automatic machine in a loop control. In one embodiment, the in-line metrology is performed using an array of microelectromechanical systems (MEMS)-based Atomic Force Microscopes (AFMs) with individual control of a location of each AFM tip. In one embodiment, the array of AFM tips has individually addressable locations. In one embodiment, an optimum positioning of the array of AFM tips on an area of a flexible substrate with a pattern, a topography variation or a variation in a thickness of a film(s) is determined. Each AFM tip in the array of AFM tips provides data that is aggregated to infer a pattern, a topography variation or a film thickness variation. The area may be scanned to measure the pattern, topography variation or film thickness variation. The measured pattern, topography variation or film thickness variation is aggregated and analyzed to infer the pattern, topography variation or film thickness variation. In one embodiment, each AFM tip of the array of AFM tips is on a different device on the same area. In one embodiment, each of these different devices is the same.

While most process optimization involves off-line metrology and operator-based process tuning, they are difficult to implement for P-FIL because of highly coupled multi-input control systems and a limited process window. It is difficult for operators, even with significant domain experience, to handle the large numbers of combinatorial choices in a systematic manner to enable defect-free execution of the process. In one embodiment, real-time sensing is used as feedback for the process in order to obtain optimum parameters. This feedback mechanism can work with a validated model of the process or with the actual machine in the loop should the forward or inverse model become intractable. In such situations, real-time process feedback may be used on its own to run "model-free" optimization, or may be used to enhance the existing model. In one embodiment, in-line metrology is used to provide feedback for optimization using a machine in a loop control.

With respect to real-time or near-real-time sensing, the process metrics that ensure reliable coating include mean and standard deviation of coating thickness over large areas, and avoidance of defect mechanisms. Current off-line metrology approaches are too slow to be incorporated in real-time process control as nanoscale measurements have to be made over centimeter scales resulting in a high-dimensional multi-scale metrology problem. New sensing architectures that are designed in conjunction with process models can be used to significantly enhance the speed of sensing and detection of process parasitics and defects. Optical techniques, such as film thickness reflectometry, ellipsometry, spectrometry, etc., are typically used in manufacturing processes as they can be fast (relative to tip-based mechanical techniques, electron microscopy, etc.) and are often non-destructive. The precision and speed trade-offs can be properly understood with careful modeling. For example, lower spatial and spectral resolution of optical techniques can increase sensing speed and models can help us understand the corresponding loss of sensed information and its potential impact on process yield.

For example, in IJ-PFIL, the sensing can happen very close to the nozzle and before the drop sits on the substrate. For SD-PFIL, too, a camera can be collocated with the die to capture the coating bead formation. However, it may be challenging as the coating gap is much smaller (<10×) than the distance between the nozzle and the substrate in a typical inkjetting environment. For SD-PFIL, then, it may be easier to capture the bead after it has been coated on the substrate to look for defects or other signatures. This can also be done using optical techniques and model-based image processing algorithms.

Planarization of feature transitions, such as step heights, presents a challenge. This is because, such sharp transitions entail a change in fluid and solid mechanical behavior, which is difficult to characterize in robust models, and which require in-situ validation. Moreover, the use of high throughput optical film thickness metrology, which works well for bulk films without sharp thickness changes within the optical spot size, is not compatible with measuring film thickness changes in the immediate vicinity of such steps. This entails the use of relatively slow tip-based surface profiling techniques, such as atomic force microscopy (AFM).

The present invention extends the idea of the AFM array for planarization with the ability to reconfigure the location of each AFM tip in the array based on the pattern layout across a full field (typically 26 mm×33 mm), typically obtained from a GDS file. More specifically, knowing the GDS file of the prior pattern(s), the prior pattern's etch depth and any subsequent film deposition on that pattern, a knowledge of the specific regions where planarization would be a challenge, could be inferred a priori through empirical or computational models, or a combination of the two. The AFM array could then be reconfigured to specifically measure in those challenging regions. This way, the AFM array can rapidly measure the film thickness profile in the vicinity of critical step transitions. Additionally, the AFM array can be devised such that it is reconfigurable across an entire area of the flexible substrate, rather than a single field. This is because most fields in a patterned area undergoing routine lithography processing, are substantially similar. The AFM array can then be arranged such that a single AFM tip has the range to address a single field. Different AFM tips can then measure different features on the substantially similar field, with each feature being on a different field. Aggregating these measurements can then provide a picture of the surface of a field. If a different field layout is then processed, the same AFM array can be reconfigured to enable metrology of the new layout. This embodiment is applicable to U.S. Pat. No. 9,415,418, which is incorporated by reference herein in its entirety.

Furthermore, machine-in-the-loop forward models, validated numerical simulations and stochastic optimal control techniques based on genetic algorithms (GA) can be used to develop sophisticated control algorithms for the P-FIL process. A hierarchical approach can be used to gradually increase the number of control variables to be included in the optimized control algorithm. For example, a sensing and actuator framework of low complexity can be first used to develop GA based process control schemes. The complexity of sensing (e.g., the spatial and spectral resolution of optical sensing) and actuator framework (e.g., number and resolution of control variables) can be gradually increased, as needed, and the GA based process control schemes can be established. At the same time, it is important to note that for IJ-PFIL, for example, inkjet parameters can be changed on the fly because of the 'drop-on-demand' nature of the process. However, the same cannot be said for SD-PFIL. There is a non-zero time constant associated with changing process parameters. Understanding and capturing this transient behavior is important to the controllability of the system.

In a R2R system with flexible substrates, process fidelity is maintained by the control of web tension. Deviations in web tension can lead to problems with web alignment, steering and worst, distortion. These problems are exacerbated when webs have to deal with temperature distributions. This is because any spatial distribution of temperature causes unequal expansion and contraction of the web. This non-uniformity creates non-uniform tension profiles. This situation can also lead to web distortion or delamination from its support roller or chuck leading to catastrophic process failure. Hence, an embodiment of the present invention involves a tension control scheme which monitors the web tension along the width of the web at the solvent evaporation and selective resist evaporation stations. The web tension may be monitored through load cells or optical sensors that detect out-of-plane distortions from which web tension may be inferred. The effect of spatial evaporation on web tension can also be included in the GA scheme with appropriate bounds on the web tension to prevent process defects.

A discussion regarding material design is now deemed appropriate.

The formulation design consists of imprint resist comprising of considerable amount of components having similar volatility, dissolved in a solvent that is considerably more volatile than the rest of the components. The solvent role is to dilute the required quantity of imprint resist to higher volume thus allowing for better way of spreading small amounts of imprint resist over the substrate in IJ-PFIL, and managing the final dry film thickness starting from a much thicker initial wet film in SD-PFIL. Once the imprint resist solution is dispensed on the substrate, the solvent evaporates first while the rest of the components evaporate at much lower rate due to their lower volatility. This results in a mixture containing higher concentration of the other components and residual or negligible amounts of solvent. The remaining, solvent-depleted liquid is then selectively evaporated leaving a substrate containing areas with controlled imprint resist distribution. After the proposed scheme of selective evaporation, the final ratio of the remaining components may not be the same as the initial ratio of the same components in the resist formulation. Furthermore, the components ratios may not be the same on various spots across the substrate after selective evaporation. However, appropriately formulated systems may perform satisfactorily under a range of compositions. Formulation design may take into account the expected amount of material that needs to be evaporated, such that the optimum range of component ratios is not disrupted. Further, certain components, such as the photoinitiator or crosslinkers, will almost always be less volatile, as seen in the table below.

Besides solvents, an imprint resist formulation may contain a mixture of some, or all the following components: an initiator; polymerizable monomers with one active group; polymerizable monomers with more than one active group referred to in the art as crosslinkers; and surfactants. This list is not exhaustive as other components may be present according to desired performance and applications.

Example for relevant components is shown in the table below:

| Role | Material | Boiling Point [° C. at 1 atm] |
| --- | --- | --- |
| Monomers | 2-Ethylhexyl methacrylate | 218 |
| | Cyclohexyl methacrylate | 210 |
| | Isobornyl methacrylate | 258 |
| | Tetrahydrofurfuryl methacrylate | 222 |
| | Benzyl methacrylate | 243 |
| Crosslinker | Ethylene glycol dimethacrylate | 240 |
| Surfactant | 1H,1H,2H,2H-Perfluorodecyltriethoxysilane | 209 |
| Photoinitiators | Irgacure 184 | >300 |
| | Irgacure 819 | >300 |
| | Irgacure 2959 | >300 |
| Solvent | MIBK | 117 |
| | Ethyl acetate | 77 |

Downstream process considerations may preclude the use of UV-crosslinkable polymers, particularly in the application of planarization, which does not require a patterning resist material. For example, most methacrylate polymers have a Tg of ~150° C. Any downstream thermal processing beyond 150° C. may damage the material. There are other thermoset polymers, such as polyimide, that have a much higher Tg of ~350° C. Hence, the practice of planarization using this polymer can alleviate concerns with thermal processing. But these materials are also highly viscous, which makes them difficult to coat or inkjet with substantially lower volumes. To achieve this, the polyimide material can be diluted in a solvent, which can reduce their viscosity and make the material amenable to coating and/or inkjetting. The solvent will need to be completely evaporated to minimize condensation on the substrate. This can be done by using a solvent with substantially higher volatility (e.g., MIBK, ethyl acetate) and using a heated substrate chuck or IR lamps to completely and rapidly evaporate the solvent. After solvent evaporation, the polymer can then be baked or cured on the substrate. For the sake of this disclosure, the liquid formulation (or "liquid resist formulation") used for this purpose is also called a "resist," having a solvent component and one or more non-solvent components.

If the substrate material is not compatible with significant temperature changes, especially if the non-solvent components of the resist require high boiling points, one embodiment of the invention can involve the use of partially evacuated chambers to reduce the boiling points of the resist components. Another embodiment can involve the use of a chuck or mount for the substrate which is substantially maintained at a constant temperature which is below the boiling points of the resist components. This chuck or mount can be metallic to enable rapid dissipation of any heat that is transferred to it from the substrate and thereby allow the substrate to substantially maintain its temperature, even in the presence of dynamic heat loads during the selective evaporation process. Another embodiment of the invention involves the use of one or more material films between the substrate and the resist material. These films could be chosen such that their combination would lead to near zero transmission of electro-magnetic radiation in the infrared spectrum to the substrate, thereby reducing the overall heating of the substrate, but can themselves absorb the heat without suffering any damage. An exemplar film material is CVD Carbon or Spin-on-Carbon (deposited using slot-die coating for example). These materials may additionally also be used as sacrificial films when transferring the resist pattern onto the substrate or an additional functional film on the substrate.

Additional material considerations for planarization include the use of silicon or carbon containing materials that facilitate good mechanical properties, such as elastic modulus, elongation to fail and failure strength. Also, the embodiment of free-surface planarization can use a low-viscosity silicon-containing resist material as discussed in Lin, M. W., "Simulation and design of planarizing materials and interfacial adhesion studies for step and flash imprint lithography", Ph.D. Dissertation, The University of Texas at Austin, 2008. This material can enable a high initial degree of planarization which can be further improved through selective evaporation of the resist material.

There are various applications in nanophotonics that can result from R2R-PFIL. Exemplar nanophotonic devices include wire-grid polarizers and metamaterials, such as flat lenses. These devices typically involve fabrication of nanostructures made of metals (Al, Au, etc.) or dielectrics (SiO$_2$, Si$_3$N$_4$, TiO$_2$, etc.). For example, wire-grid polarizers for display applications require nanoscale patterns made of aluminum. Such polarizers can be fabricated using one of two approaches. In the first approach, a polymer resist line/space pattern can be obtained using the PFIL process. This can be followed by Glancing Angle Deposition of Al on the line/space pattern such that the metal remains discontinuous. The second approach involves deposition of an Al film using vacuum-based processes, such as e-beam evaporation, followed by the imprinting of a polymer resist line/space pattern using PFIL. This is then followed by a descum etch of the residual layer using O$_2$ plasma and etching of the underlying Al film using Cl-based plasma chemistry.

Metamaterials, such as flat lenses, have been discussed in the context of enabling interaction of visible light with nanoscale patterns to achieve phenomena that are otherwise impossible in the absence of nanoscale patterns. Flat lenses, for example, enable the 'refraction' of light from flat surfaces, that would otherwise have required some curvature. These lenses are enabled by fabricating specific nanoscale patterns on the flat surface that interact with incoming light to result in refraction. These nanoscale patterns are made of high-index dielectric materials, most notable, TiO$_2$. Such flat lenses can be made using PFIL in combination with other nanoscale fabrication techniques. One approach for the fabrication of flat lenses involves imprinting the negative of the desired TiO$_2$ pattern with a polymerized resist using PFIL. This is followed by slot-die coating of a sol-gel TiO$_2$ precursor, which fills the resist "mold" and forms a continuous film at the top. This continuous film of the TiO$_2$ precursor can be etched using reactive ion etching in a O$_2$/Ar/F based plasma. Alternatively, the features on this resist pattern can be modified at the top to make them tapered. Such structures can be fabricated using multi-tiered templates fabricated for imprint lithography. This would allow the sol-gel TiO$_2$ precursor to substantially fill the resist mold without forming a substantially continuous film at the top, provided the volume of the precursor is tightly controlled in the slot-die coating process. Another approach can involve conformal Chemical Vapor Deposition or Atomic Layer Deposition of TiO$_2$ to fill the resist mold, followed by an etch-back of the continuous TiO$_2$ film at the top of the mold. In all cases, the resist pattern can be removed using O$_2$ plasma.

After fabrication of these nanophotonic devices, it may be necessary to also encapsulate them with barrier films to prevent diffusion of water vapor, oxygen or other materials that can damage the devices. Encapsulation can be done by using vacuum-based vapor deposition techniques that preferentially accumulate material at corners and thereby cap the top of the nanoscale features while leaving an air gap below them and between successive features.

A discussion regarding fabricating nanoscale patterns made of high-index dielectric materials, such as TiO$_2$, on a flat surface is provided below in connection with FIGS. 9 and 10A-10D.

Figure 9:
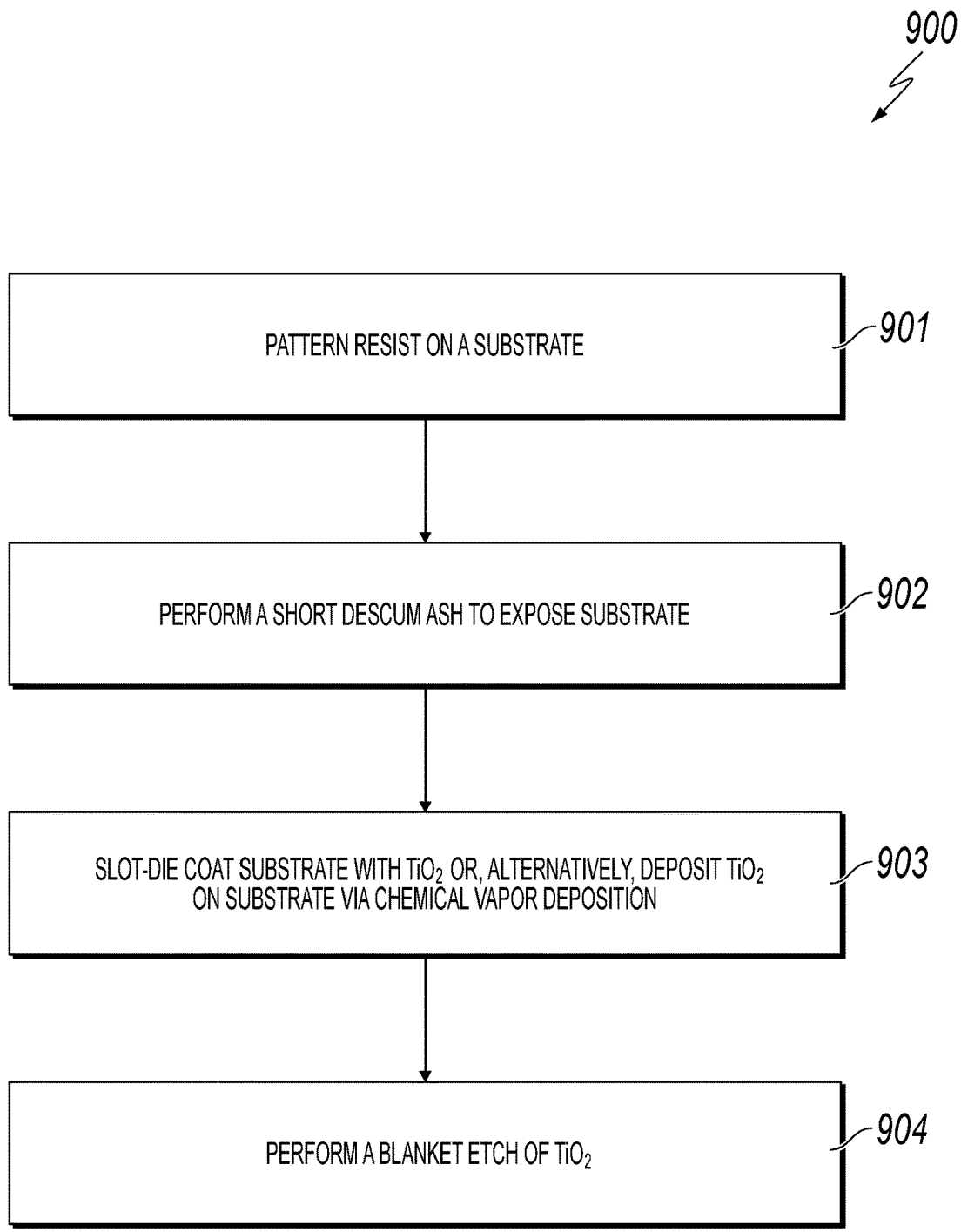
FIG. 9 is a flowchart of a method for fabricating nanoscale patterns made of high-index dielectric materials, such as $TiO_2$, on a flat surface in accordance with an embodiment of the present invention.

FIG. 9 is a flowchart of a method 900 for fabricating nanoscale patterns made of high-index dielectric materials, such as TiO$_2$, on a flat surface in accordance with an embodiment of the present invention. FIGS. 10A-10D depict the cross-sectional views of fabricating nanoscale patterns on a flat surface using the steps described in FIG. 9 in accordance with an embodiment of the present invention.

Figure 10A:
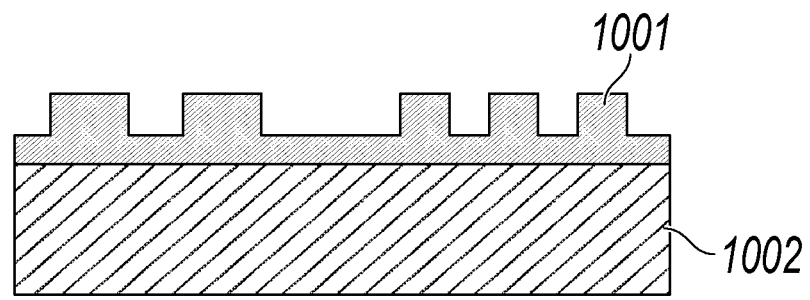
FIGS. 10A-10D depict the cross-sectional views of fabricating nanoscale patterns on a flat surface using the steps described in FIG. 9 in accordance with an embodiment of the present invention.

Referring to FIG. 9, in conjunction with FIGS. 10A-10D, in step 901, resist 1001 is patterned on a substrate 1002 as shown in FIG. 10A.

Figure 10B:
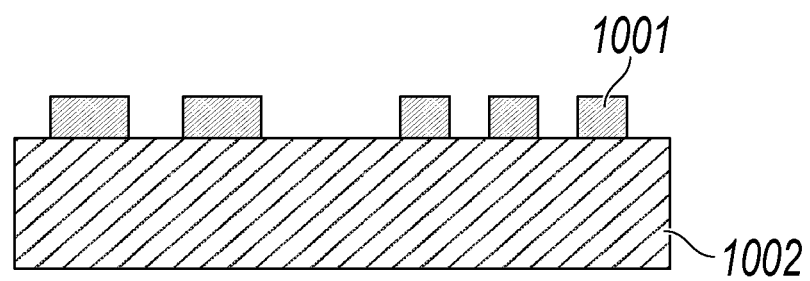

In step 902, a short descum ash is performed to expose substrate 1002 as shown in FIG. 10B.

Figure 10C:
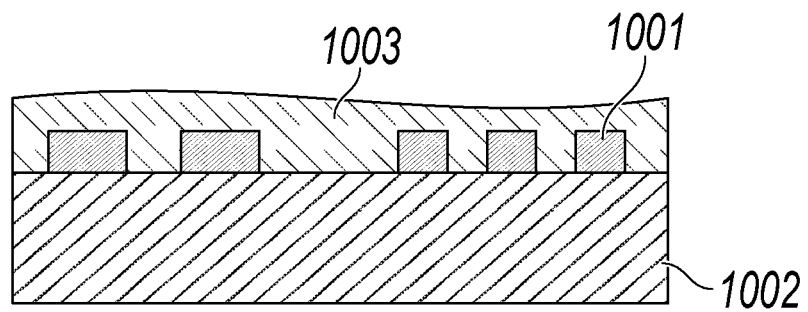

In step 903, substrate 1002 is slot-die coated with TiO$_2$ 1003 or, alternatively, TiO$_2$ 1003 is deposited on substrate 1002 via chemical vapor deposition as shown in FIG. 10C.

Figure 10D:
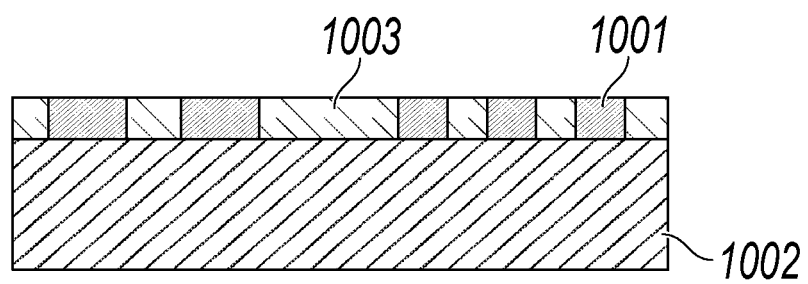

In step 904, a blanket etch of TiO$_2$ 1003 is performed as shown in FIG. 10D.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for fabricating patterns on a flexible substrate in a roll-to-roll configuration, the method comprising:
   implementing an inverse optimization scheme to determine process parameters used to obtain a desired film thickness profile of a liquid resist formulation;
   covering said flexible substrate in said roll-to-roll configuration with a substantially continuous film of said liquid resist formulation, using one or more of the following techniques: dispensing discrete drops of a monomer on a substrate using an inkjet and allowing said dispensed drops to spontaneously spread and merge to form said substantially continuous film of said liquid resist formulation, slot-die coating, dip coating, gravure coating and knife-edge coating, wherein said liquid resist formulation is diluted in a solvent on said substrate, wherein one or more process parameters of said one or more techniques are determined from said inverse optimization scheme;
   evaporating by heating said solvent substantially from said liquid resist formulation forming a film;
   closing a gap between a template fabricated with nanoscale or micro-scale patterns and said substrate to fill features of said template with said film;
   curing said film to polymerize said film; and
   separating said substrate from said template leaving said polymerized film on said substrate, wherein said liquid resist formulation, whose solvent has already been evaporated, is selectively evaporated to form said film with a profile to match the desired thickness profile prior to closing said gap between said template and said substrate.

2. The method as recited in claim 1, wherein said selective evaporation is carried out by one or more of the following: an array of individually controllable infrared lamps, an array of individually controllable fans to control air flow, an array of individually controllable micro heaters or coolers on said substrate, and a spatial light modulator to control one or more sources of electromagnetic radiation.

3. The method as recited in claim 1, wherein a stack of one or more films is used between said liquid resist formulation and said substrate that substantially absorbs electromagnetic radiation.

4. The method as recited in claim 1, wherein in-line metrology is used to provide feedback for said inverse optimization scheme using a machine in a loop control.

5. The method as recited in claim 1, wherein a forward model is used as a core for said inverse optimization scheme to predict a film thickness profile, wherein said forward model incorporates one or more of the following: thermal transport, solute transport, and solvent transport.

6. The method as recited in claim 1, wherein said liquid resist formulation consists of said solvent with substantially higher volatility than the rest of the components of said liquid resist formulation.

7. The method as recited in claim 1, wherein said template is patterned with a lateral feature dimension of less than 500 nm.

8. The method as recited in claim 1, wherein said template is flexible or held in a roll-to-roll configuration.

9. A method for depositing a film on a flexible substrate held in a roll-to-roll configuration, the method comprising:
   implementing an inverse optimization scheme with a desired film thickness profile as an input which is used to determine process parameters of a liquid resist formulation, wherein said liquid resist formulation comprises a solvent and one or more non-solvent components;
   covering said flexible substrate in a roll-to-roll configuration with a substantially continuous film of said liquid resist formulation using one or more of the following techniques: dispensing discrete drops of a monomer on said substrate using an inkjet and allowing said dispensed drops to spontaneously spread and merge, and slot die coating, wherein said liquid resist formulation is diluted in said solvent, wherein one or more process parameters of said one or more techniques are determined from said inverse optimization scheme;
   evaporating by heating said solvent substantially from said liquid resist formulation forming a film; and
   curing said film to polymerize said film, wherein said liquid resist formulation, whose solvent has already been evaporated, is selectively evaporated to form said film with an intentional thickness profile that leads to said desired thickness profile prior to said curing.

10. The method as recited in claim 9, wherein said desired thickness profile is uniform and said intentional thickness profile is non-uniform to compensate for process parasitics.

11. The method as recited in claim 9, wherein said selective evaporation is carried out by one or more of the following: an array of individually controllable infrared lamps, an array of individually controllable fans to control air flow, an array of individually controllable micro heaters or coolers on said substrate, and a spatial light modulator to control one or more sources of electromagnetic radiation.

12. The method as recited in claim 9, wherein a stack of one or more films is used between said liquid resist formulation and said substrate that substantially absorbs electromagnetic radiation.

13. The method as recited in claim 9, wherein in-line metrology is used to provide feedback for said inverse optimization scheme using a machine in a loop control.

14. The method as recited in claim 9, wherein a forward model is used as a core for said inverse optimization scheme to predict a film thickness profile, wherein said forward model incorporates one or more of the following: thermal transport, solute transport, and solvent transport.

15. The method as recited in claim 9, wherein said liquid resist formulation consists of said solvent with substantially higher volatility than the rest of the components of said liquid resist formulation.

16. The method as recited in claim 9, wherein a superstrate is used to cover a top of said film to obtain desired evolution dynamics of said film.

* * * * *